(12) United States Patent
Takemura et al.

(10) Patent No.: US 7,573,304 B2
(45) Date of Patent: Aug. 11, 2009

(54) INPUT/OUTPUT CIRCUIT AND INPUT/OUTPUT DEVICE

(75) Inventors: Takashi Takemura, Kanagawa (JP); Kenji Arai, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/039,942

(22) Filed: Feb. 29, 2008

(65) Prior Publication Data

US 2008/0150616 A1 Jun. 26, 2008

Related U.S. Application Data

(62) Division of application No. 11/164,479, filed on Nov. 24, 2005, now Pat. No. 7,362,145.

(30) Foreign Application Priority Data

Nov. 25, 2004 (JP) ............................. 2004-339880

(51) Int. Cl.
*H03B 1/00* (2006.01)

(52) U.S. Cl. .................. 327/108; 327/112; 326/82; 326/83; 326/86; 326/87

(58) Field of Classification Search ................ None
See application file for complete search history.

(56) References Cited

U.S. PATENT DOCUMENTS

| | | | | |
|---|---|---|---|---|
| 5,338,978 A | * | 8/1994 | Larsen et al. | 326/21 |
| 5,396,128 A | | 3/1995 | Dunning et al. | |
| 5,721,508 A | * | 2/1998 | Rees | 327/382 |
| 5,831,449 A | | 11/1998 | Shigehara et al. | |
| 5,831,458 A | | 11/1998 | Nakagawa | |
| 6,084,431 A | | 7/2000 | Shigehara et al. | |
| 6,292,025 B1 | | 9/2001 | Okumura | |
| 6,323,684 B1 | * | 11/2001 | Oshima | 326/81 |
| 6,577,163 B1 | | 6/2003 | Waldrip et al. | |

FOREIGN PATENT DOCUMENTS

| | | | |
|---|---|---|---|
| JP | 9139087 A | 5/1997 |
| JP | 2002280892 A | 9/2002 |

* cited by examiner

*Primary Examiner*—Tuan Lam
(74) *Attorney, Agent, or Firm*—Volentine & Whitt, P.L.L.C.

(57) ABSTRACT

An input/output circuit has an output terminal, a first transistor, a second transistor, a pulse generator, and a bias circuit. The first transistor drives the output terminal based on a predetermined signal. The second transistor controls a potential of the gate of the first transistor. The pulse generator outputs a pulse with a predetermined time width when a level of the predetermined signal changes. The bias circuit generates a bias voltage for controlling the second transistor when the pulse is outputted, and impressing the bias voltage to the gate of the second transistor.

6 Claims, 6 Drawing Sheets

INPUT/OUTPUT CIRCUIT AND INPUT/OUTPUT DEVICE

CROSS-REFERENCE TO RELATED APPLICATIONS

This application is a divisional application of application Ser. No. 11/164,479, filed Nov. 24, 2005, now U.S Pat. No. 7,362,145, which is hereby incorporated for all purposes.

BACKGROUND OF THE INVENTION

1. Field of the Invention

The present invention relates to an input/output circuit and an input/output device, which in particular are capable of impressing into an output terminal an external power supply voltage which is higher than an operation voltage, and have a tolerant function which pulls an output potential up to the level of the external power supply voltage.

2. Description of the Background Art

In recent years, as semiconductor integrated circuits have turned to require less power, technology which makes the semiconductor integrated circuits require less voltage is being pursued. However, in connecting different semiconductor integrated circuits which operate with different power supply voltage (i.e. with different signal level), the semiconductor integrated circuit operating with the lower power supply voltage may not be able to endure the influence of the semiconductor integrated circuit operating with the higher power supply voltage, as a result of which the semiconductor integrated circuit operating with the lower power supply voltage may be damaged. For example, if a semiconductor integrated circuit which operates with a power supply voltage of 3.3 V (hereinafter referred to as 3V system semiconductor integrated circuit) and a semiconductor integrated circuit which operates with a power supply voltage of 5 V (hereinafter referred to as 5V system semiconductor integrated circuit) are connected, the 3V system semiconductor integrated circuit may be damaged by the influence of the 5V system semiconductor integrated circuit.

In order to cope with such problem, in the conventional art, it has been common for an input/output circuit which is capable of impressing an external power supply voltage that is higher than an internal power supply voltage, or an input/output circuit which is capable of pulling the power supply voltage up to the level of the external power supply voltage that is higher than the internal power supply voltage, to be used as a signal interface with respect to a semiconductor integrated circuit on the lower voltage side.

Such input/output circuit is disclosed in Japanese Laid Open Patent Application No. 9-139087 (hereinafter to be referred to as patent reference 1) and Japanese Laid Open Patent Application No. 2002-280892 (hereinafter to be referred to as patent reference 2), for instance. In a prior art input/output circuit as introduced by the patent references 1 and 2, a first p-channel MOS (metal oxide semiconductor) transistor (hereinafter to be referred to as P-MOS transistor) for pull-up and a first n-channel MOS transistor (hereinafter to be referred to as N-MOS transistor) for pull-down are connected in series, and to this connecting part, an output pad is connected. Between the gate of the first P-MOS transistor and the output pad, a switch of a second P-MOS transistor is connected. On the other hand between the drain of the first N-MOS transistor and the output pad, a second N-MOS transistor for reducing a voltage impressed between the source and drain of the first N-MOS transistor is connected.

In this structure, when an external voltage which is higher than an internal power supply voltage is impressed to the output pad, for instance, the second P-MOS transistor will be turned on. Through this operation, the second P-MOS transistor will function as an output transistor. At this time, the first P-MOS transistor will be turned off as the gate potential of the first P-MOS transistor becomes the external voltage, and therefore, current flow from the output pad toward the side of the internal power supply voltage can be prevented. In addition, even when a voltage surpassing a withstand pressure of the first N-MOS transistor is impressed to the output pad, it is possible to prevent the first N-MOS transistor from being damaged by the voltage impressed to the output pad because the voltage impressed between the source and drain of the first N-MOS transistor is being reduced by the second N-MOS transistor.

In the prior art input/output circuit as described above, when the external voltage which is higher than the internal power supply voltage is impressed, current will flow into a node connected to the gate of the first P-MOS transistor via the second P-MOS transistor having the internal power supply voltage being impressed to its gate. Due to such operation, this node, i.e. the gate of the first P-MOS transistor, will be pulled up to the level of the external voltage and the first P-MOS transistor will be turned off. Thereby, a current path from the output pad to the side of the internal power supply voltage will be shut off.

In such structure, however, if, for instance, in a normal operation, an external power supply voltage surpassing the internal power supply voltage is impressed to the output pad while the first P-MOS transistor is being turned on, it takes a while until the first P-MOS transistor turned off. In other words, the first P-MOS transistor will continue to be turned on until the gate potential of the first P-MOS transistor is pulled up to the level of the external power supply voltage, which results in having components which charge the gate of the first P-MOS transistor and components which flow into the side of the internal power supply voltage via the first P-MOS transistor incorporated in the current from the external power supply voltage. Therefore, it will take time to have the gate potential of the first P-MOS transistor pulled up by the time the first P-MOS transistor is turned off (i.e. steps will occur in the pull-up waveform), which leads to a problem of increasing power consumption.

In view of the above, it will be apparent to those skilled in the art from this disclosure that there exists a need for an improved input/output circuit and an improved input/output device. This invention addresses this need in the art as well as other needs, which will become apparent to those skilled in the art from this disclosure.

SUMMARY OF THE INVENTION

It is therefore an object of the present invention to resolve the above-described problems, and to provide an input/output circuit and an input/output device, which are capable of preventing an increase in power consumption.

In accordance with a first aspect of the present invention, an input/output circuit has an output terminal, a first transistor, a second transistor, a pulse generator, and a bias circuit. The first transistor drives the output terminal based on a predetermined signal. The second transistor controls a potential of the gate of the first transistor. The pulse generator outputs a pulse with a predetermined time width when a level of the predetermined signal changes. The bias circuit generates a bias voltage for controlling the second transistor when the pulse is outputted, and impressing the bias voltage to the gate of the second transistor.

In accordance with a second aspect of the present invention, an input/output circuit has an output terminal, a first transistor, a second transistor, a bias circuit, and a third transistor. The first transistor drives the output terminal based on a predetermined signal. The second transistor controls a potential of the gate of the first transistor. The bias circuit generates a bias voltage for controlling the second transistor based on the level of the predetermined signal, and impressing the bias voltage to the gate of the second transistor. The third transistor switches a voltage which is impressed to the gate of the second transistor based on a potential of the output terminal.

In accordance with a third aspect of the present invention, an input/output circuit has an input terminal for signal, a first transistor, a second transistor, and a bias circuit. The first transistor is connected to the input terminal. The second transistor drives the gate of the first transistor. The bias circuit generates a bias voltage for controlling the second transistor based on a predetermined voltage, and impressing the bias voltage to the gate of the second transistor.

In accordance with a fourth aspect of the present invention, an input/output circuit has a first circuit and a second circuit. The first circuit has an output terminal, a first transistor driving the output terminal based on a predetermined signal, a second transistor controlling a potential of the gate of the first transistor, a pulse generator outputting a pulse with a predetermined time width when a level of the predetermined signal changes, and a first bias circuit generating a first bias voltage for controlling the second transistor when the pulse is outputted, and impressing the first bias voltage to the gate of the second transistor. The second circuit has a signal input terminal, a third transistor connected to the input terminal, a fourth transistor driving the gate of the third transistor, and a second bias circuit generating a second bias voltage for controlling the fourth transistor based on a predetermined voltage, and impressing the second bias voltage to the gate of the fourth transistor.

In accordance with another aspect of the present invention, an input/output device has a first circuit and a second circuit. The first circuit has an output terminal, a first transistor driving the output terminal based on a predetermined signal, a second transistor controlling a potential of the gate of the first transistor, a pulse generator outputting a pulse with a predetermined time width when a level of the predetermined signal changes, and a first bias circuit generating a first bias voltage for controlling the second transistor when the pulse is outputted, and impressing the first bias voltage to the gate of the second transistor. The second circuit has a signal input terminal, a third transistor connected to the input terminal, a fourth transistor driving the gate of the third transistor, and a second bias circuit generating a second bias voltage for controlling the fourth transistor based on a predetermined voltage, and impressing the second bias voltage to the gate of the fourth transistor. The first and second circuits are formed in a predetermined semiconductor chip.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

A first embodiment of the present invention will be described with reference to the drawings. With respect to this embodiment, a tristate output circuit will be shown as an example of an input/output circuit according to the present invention. A tristate output circuit is capable of having an external power supply voltage higher than an operation voltage impressed to an output terminal, and it has a tolerant function which allows an output potential to be pulled up to the level of the external power supply voltage. This tristate output circuit is an output interface.

Structure

Figure 1:
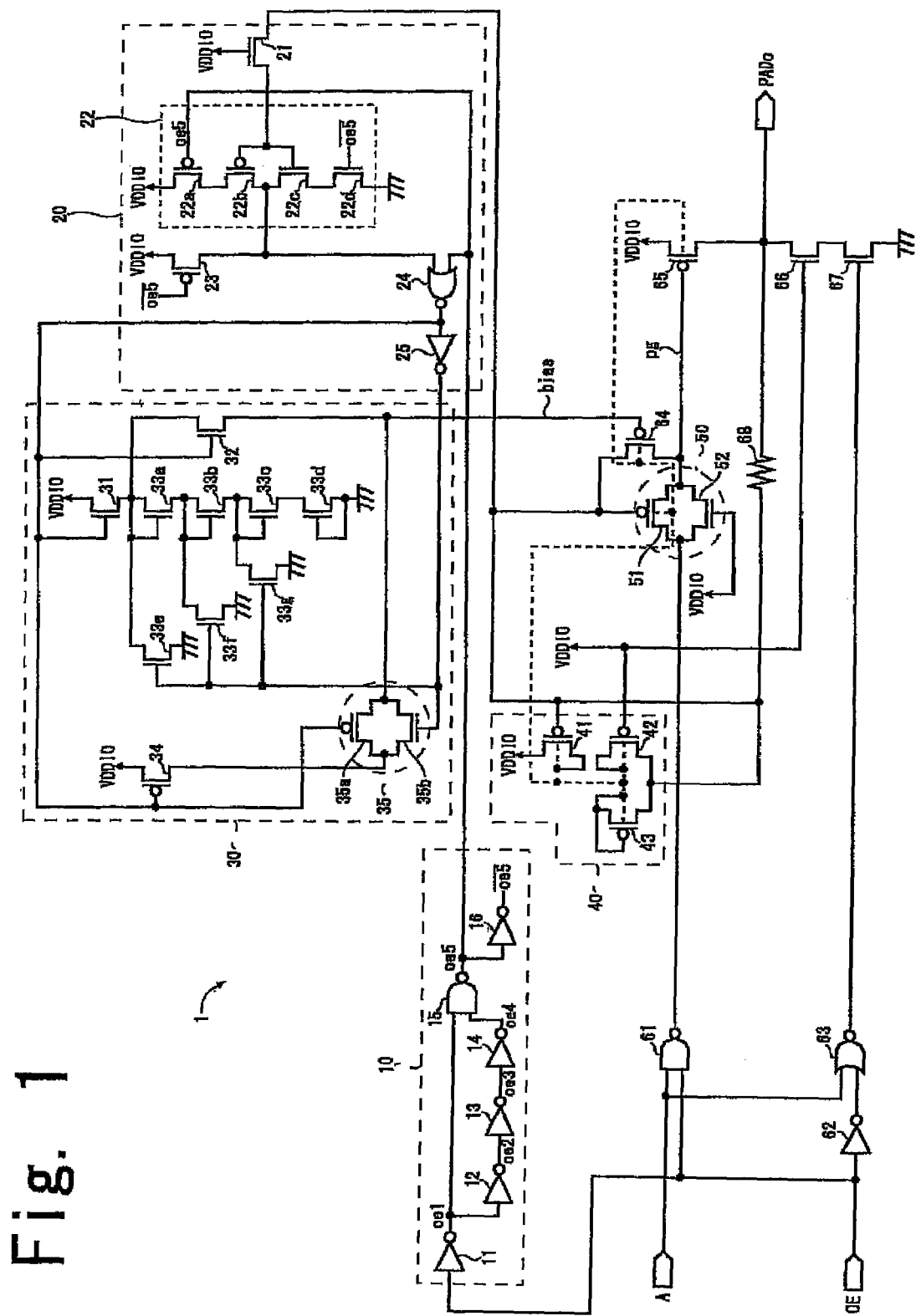
FIG. 1 is a circuit diagram showing a structure of a tristate output circuit 1 according to a first embodiment of the present invention.

FIG. 1 is a circuit diagram showing a structure of a tristate output circuit 1 according to the first embodiment of the present invention. As shown in FIG. 1, the tristate output circuit 1 has a one-shot pulse generation circuit 10 (pulse generator), an OE/PAD potential judging circuit 20, a bias circuit 30, a floating well charging circuit 40, a transfer gate 50, a two-input NAND circuit 61, an inverter 62, a two-input NOR circuit 63, a p-type MOS transistor (hereinafter to be referred to as P-MOS transistor) 64 (second transistor), a P-MO5 transistor 65 (first transistor), an n-type MOS transistor (hereinafter to be referred to as N-MOS transistor) 66 (third transistor), an N-MOS transistor 67 (fourth transistor), and a resistor 68. In this tristate output circuit 1, an input signal a inputted to an input terminal A is outputted to an output pad PADo (output terminal).

Note that the tristate output circuit 1 includes a structure which authorizes or unauthorizes output based on an output enable signal (predetermined signal) oe. For example, if an H level enable signal oe (i.e. in this case, a signal which enables output) is inputted to an input terminal OE, the tristate output circuit 1 will output an input signal a inputted to the input terminal A to the output pad PADo (output authorized). On the other hand, if an L level enable signal oe (i.e. in this case, a signal which disenables output) is inputted to the input terminal OE, the tristate output circuit 1 will hold the output under an indefinite state, i.e. a high impedance state (hereinafter to be referred to as high impedance state), and shut off output from the output pad PADo (output unauthorized).

Now, the structure of the tristate output circuit 1 will be described in more detail. As shown in FIG. 1, the input terminal A is connected with one of the two inputs of the two-input NAND circuit 61 and one of the two inputs of the two-input NOR circuit 63, which are connected in an input stage of the tristate output circuit 1, respectively. To the other one of the two inputs of the two-input NAND circuit 61 the input terminal OE is connected. Therefore, the two-input NAND circuit 61 will output L level only when the input signal a and the enable signal oe are both at H level. An output of the two-input NAND circuit 61 is connected to the gate of the P-MOS transistor 65, which is formed in an output stage of the tristate output circuit 1, through the transfer gate 50 described below.

To the other one of the two inputs of the two-input NOR circuit 63, the input terminal OE is connected through the inverter 62. Therefore, the two-input NOR circuit 63 will output H level only when the input signal a is at L level and the enable signal oe is at H level (i.e. the output from the inverter 62 is at L level). An output of the two-input NOR circuit 63 is connected to the gate of the N-MOS transistor 67 which is formed in the output stage of the tristate output circuit 1.

In the output stage of the tristate output circuit 1, the P-MOS transistor 65 and the N-MOS transistor 67 are connected. As mentioned above, the output of the two-input NAND circuit 61 is connected to the gate of the P-MOS transistor 65 through the transfer gate 50, and the output of the two-input NOR circuit 63 is connected to the gate of the N-MOS transistor 67. The P-MOS transistor 65 and the N-MOS transistor 67 are transistors for driving the output pad PADo.

Now the operation of the P-MOS transistor 65 and the N-MOS transistor 67 will be described in detail. When the enable signal oe and the input signal a are both at H level, L level, which is outputted from the two-input NAND circuit 61, will be impressed to the gate of the P-MOS transistor 65 via the transfer gate 50. Thereby, the P-MOS transistor 65 will be turned on, and the output pad PADo and a power supply line (hereinafter to be referred to as internal power supply VDDIO) to which an internal power supply voltage VDDIO is impressed will be short-circuited, which results in bringing a potential of the output pad PADo to H level. At this time, since L level is being outputted from the two-input NOR circuit 63, the N-MOS transistor 67 is being turned off. In addition, the internal power supply voltage is an operational potential for making the transistors operate normally.

On the other hand, when the enable signal oe is at H level and the input signal a is at L level, H level, which is outputted from the two-input NOR circuit 63, will be impressed to the gate of the N-MOS transistor 67. Thereby, the N-MOS transistor 67 will be turned on, and the output pad PADo will be grounded via the N-MO5 transistors 66 and 67, which results in bringing the potential of the output pad PADo to L level. At this time, since H level is being outputted from the two-input NAND circuit 61, the P-MOS transistor 65 is being turned off.

Moreover, when the enable signal be is at L level, the two-input NAND circuit 61 will output H level and the two-input NOR circuit 63 will output L level. Thereby, the P-MOS transistor 65 and the N-MOS transistor 67 will be turned off, and the output pad PADo will be under the high impedance state.

A floating well potential (hereinafter to be referred to as well potential) of the P-MOS transistor 65, i.e. a backgate potential, is charged up to the level of the VDDIO or the external power supply voltage (VTT) by the floating well charging circuit 40 described below. In this description, it will be assumed that the internal power supply voltage VDDIO is 3.3 V (volt) and the external power supply voltage VTT is 5 V, for example, To the gate of the N-MOS transistor 66 (q.v. FIG. 1) connected between the N-MOS transistor 67 and the ground, the internal power supply voltage VDDIO is constantly being impressed. In other words, the N-MO5 transistor 66 is always being turned on.

This N-MOS transistor 66 functions as a protection element for preventing possible damages to the N-MOS transistor 67. Therefore, the N-MOS transistor 66 is a circuit element which enables one of the tolerant functions according to this embodiment, which is to allow impression of the external power supply voltage VTT.

For example, if the external power supply voltage VTT (5 V) higher than the internal power supply voltage VDDIO (3.3 V) is impressed to the output pad PADo, a potential difference between the external power supply voltage VTT and the ground potential (i.e. the external power supply voltage VTT=5 V) will be directly impressed to between the drain and source of the N-MOS transistor 67, and there may be a possibility that the N-MOS transistor 67 may not be able to endure this potential difference and may be damaged.

In order to resolve this problem, as shown in FIG. 1, the N-MOS transistor 66, which is kept constantly turned on, is connected between the output pad PADo and the N-MOS transistor 67. By this arrangement, the voltage impressed to the drain of the N-MOS transistor 67 will become equal to a voltage impressed to the gate of the N-MOS transistor 66 from which a threshold voltage Vthn is subtracted. Thereby, it becomes possible to prevent the potential difference between the output pad PADo and the ground from being directly impressed to between the drain and source of the N-MOS transistor 67, and therefore prevent the N-MOS transistor 67 from being damaged.

Furthermore, as shown in FIG. 1, the enable signal oe inputted from the input terminal OE is also inputted to the one-shot pulse generation circuit 10. The one-shot pulse generation circuit 10 functions as a means to output a pulsed signal (corresponding to a pulse signal oe5 or oe-5 described below) with a predetermined time width, at the time when the enable signal oe changes from H level to L level.

This one-shot pulse generation circuit 10, as shown in FIG. 1, includes an inverter 11 (first inverter), an odd number (three in FIG. 1) of inverters 12, 13 and 14 (second inverters), two-input NAND circuit 15, and an inverter 16 (third inverter). The number of inverters (inverters 12 to 14 in FIG. 1) connected in series between the inverter 11 and the two-input NAND circuit 15 is a factor which decides a time width of the pulse signals oe 5 and oe-5. The number of these inverters is not limited to three as in FIG. 1, but can be changed according to the situation. However, in this embodiment, since the one-shot pulse generation circuit 10 generates the pulse signal oe5 using the two-input NAND circuit 15, the number of the second inverters has to be an odd number.

The inverter 11 in the one-shot pulse generation circuit 10 is connected in an input stage of the one-shot pulse generation circuit 10. The enable signal oe inputted from the input terminal OE is first inputted to the input of the inverter. 11. The output of the inverter 11 is branched into two. One branch is connected to one of the two inputs of the two-input NAND circuit 15 connected in an output stage of the one-shot pulse generation circuit 10, and the other branch is connected to the other one of the two inputs of the two-input NAND circuit 15 through the inverters 12, 13 and 14.

Figure 2:
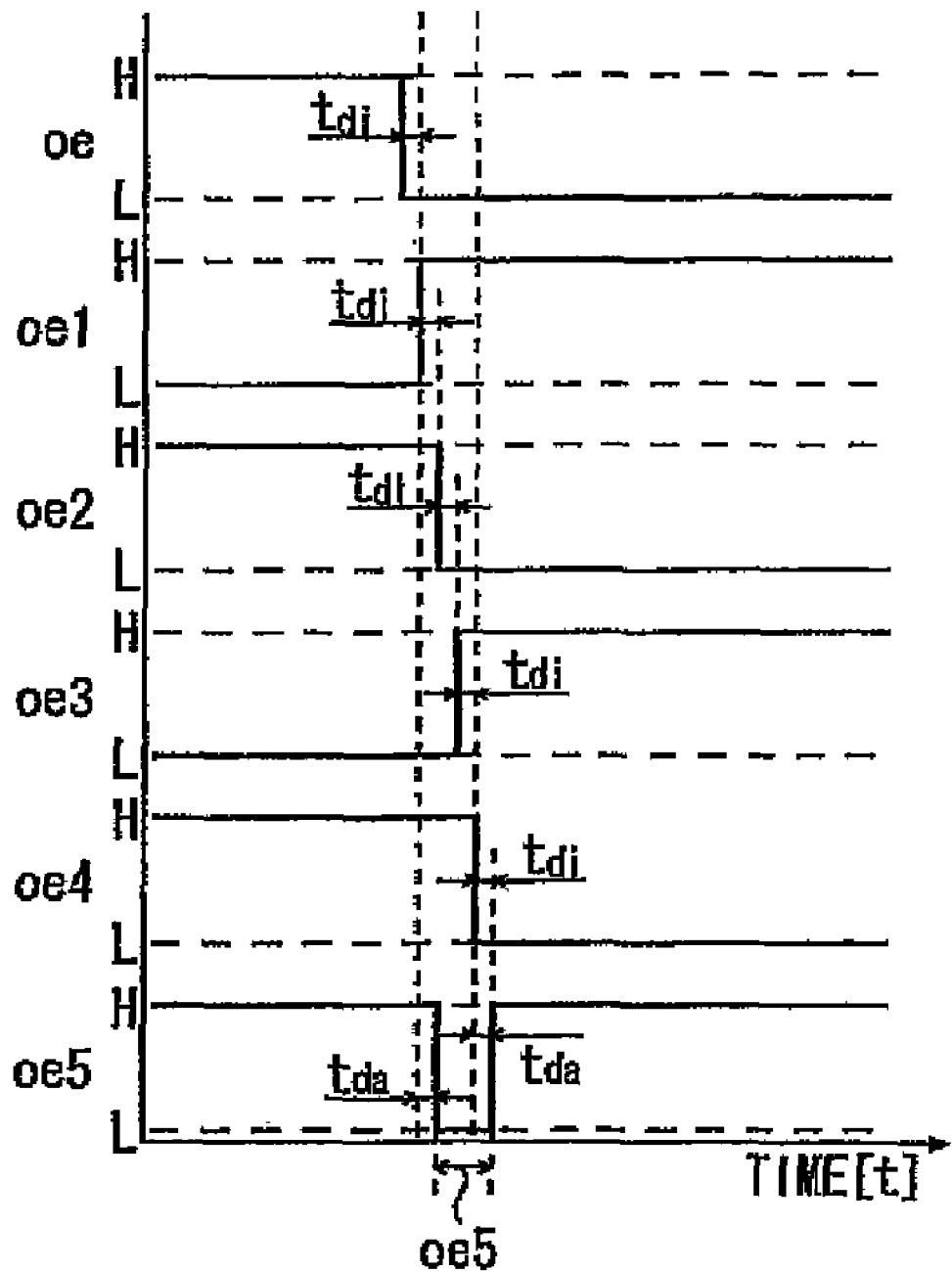
FIG. 2 is a diagram showing signal waves inside a one-shot pulse generation circuit in the tristate output circuit 1 according to the first embodiment of the present invention.

Waveforms of the enable signal oe inputted to the one-shot pulse generation circuit 10, signals oe1, oe2, oe3, and oe4 which the inverters 11, 12, 13 and 14 output, respectively, and the pulse signal oe5 which the two-input NAND circuit 15 outputs are shown in FIG. 2.

As shown in FIG. 2, for instance, the enable signal oe changing from H level to L level is inputted from the input terminal CE. The enable signal oe represents a signal state in changing the output from an enable state to a disenable state. This enable signal oe is inverted at the inverter 11 (q.v. signal oe1 in FIG. 2) and outputted as the signal oe1 to the inverter 12 and to one of the two inputs of the two-input NAND circuit 15.

Note that a signal which passes through the inverter 11 is forced to be delayed. In the following description of the operation, a signal which passes through the inverters 12, 13 and 14 is also to be delayed. Here, delay time of each of the inverters 11, 12, 13 and 14 is to be assumed as tdi. While taking this into consideration, as shown in FIG. 2, an up edge of the signal oe1 is delayed from a down edge of the enable signal oe by the delay time tdi. Likewise, since a signal passing through the inverters 12, 13 and 14 is to be delayed due to circuit factors, a down edge of the signal oe2 is delayed from the up edge of the signal oe1 by the delay time tdi, an up edge of the signal oe3 is delayed from the down edge of the signal oe2 by the delay time tdi, and a down edge of the signal oe4 is delayed from the up edge of the signal oe3 by the delay time tdi.

As a result, the signal oe4 having its down edge delayed from the up edge of the signal oei, which is inputted to one of the two inputs of the two-input NAND circuit 15, by 3×tdi will be inputted to the other one of the two inputs of the two-input NAND circuit 15. In other words, the signal oe4 will be inputted to the two-input NAND circuit 15 with a delay of 3×tdi from the signal oe1.

In order to take a logical product of the signal oe1 and the signal oe4, the two-input NAND circuit 15 outputs the pulse signal oe5 having a time width (3×tdi) corresponding to the total delay time (q.v. FIG. 2). However, the two-input NAND circuit 15 itself causes a delay due to circuit factors, and if this delay time is assumed as tda, a down edge of the pulse signal oe5 is delayed from the up edge of the signal oe1 by the delay time tda, and an up edge of the pulse signal oe5 is delayed from an up edge of the signal oe4 by the delay time tda (q.v. FIG. 2).

Now, turning back to FIG. 1, a circuit structure will be described. The pulse signal oe5 outputted from the two-input NAND circuit 15 of the one-shot pulse generation circuit 10 is inputted to the OF/PAD potential judging circuit 20 directly, and at the same time, the pulse signal oe5 is inverted at the inverter 16 and then inputted to the OF/PAD potential generation circuit 20.

Details of this structure are as follows. The output of the two-input NAND circuit 15, which is connected in the output stage of the one-shot pulse generation circuit 10, is branched into two. One branch is connected to one of the two inputs of a two-input NOR circuit 24 in the OE/PAD potential judging circuit 20, and at the same time to the gate of a P-MOS transistor 22a which is one constituent of a clocked inverter 22 in the OF/PAD potential judging circuit 20. In other words, the pulse signal oe5 is inputted to one of the two inputs of the two-input NOR circuit 24 in the OF/PAD potential judging circuit 20 and to a control terminal (i.e. the gate) of the P-MOS transistor 22a which controls the operation of the clocked inverter 22, respectively.

On the other hand, the other branch passes through the inverter 16, and then it is connected to the gate of an N-MOS transistor 22d which is one constituent of the clocked inverter 22 in the OE/PAD potential judging circuit 20, and at the same time to the gate of a P-MO5 transistor 23 in the OF/PAD potential judging circuit 20. In other words, the inverted pulse signal oe5 (hereinafter to be referred to as pulse signal –oe5) is inputted to a control terminal (i.e. the gate) of the N-MOS transistor 22d, which controls the operation of the clocked inverter 22, and to a control terminal (i.e. the gate) of the P-MOS transistor 23, which serves to input the internal power supply voltage VDDIO to the other one of the two inputs of the two-input NOR circuit 24 at the time when the clocked inverter 22 is non-operating, respectively.

The OE/PAD potential judging circuit 20, to which the pulse signal oe5 and the pulse signal –oe5 are inputted in a way just described, serves as a means (i.e. a potential judgment output circuit) to judge the potential of the output pad PADo while the pulse signals oe5 and –oe5 are outputted, i.e. when a signal level of the enable signal oe is changed, and to output a voltage for outputting a bias voltage Vbias from a bias circuit 30 (which will be described below) on the basis of its judging result.

As shown in FIG. 1, this OE/PAD potential judging circuit 20 includes an N-MOS transistor 21, the clocked inverter 22, the P-MOS transistor 23, the two-input NOR circuit 24 and an inverter 25.

The N-MOS transistor 21 connected in an input stage of the OE/PAD potential judging circuit 20 has the internal power supply voltage VDDIO constantly impressed to its gate. In other words, the N-MOS transistor 21 is always being turned on. The source of the N-MOS transistor 21 is connected to the output pad PADo via the resistor 68. The drain of the N-MOS transistor 21 is connected to the gate of a P-MOS transistor 22b and the gate of an N-MOS transistor 22c, which are components of the clocked inverter 22 located in a rear stage when looking from the output pad PADo, respectively.

This N-MOS transistor 21 serves as a protection element which in particular prevents the N-MOS transistor 22c in the clocked inverter 22 from being damaged. Therefore, the N-MOS transistor 22 is a circuit element which enables one of the tolerant functions according to this embodiment, which is to allow impression of the external power supply voltage VTT.

Although the clocked inverter 22 monitors the potential of the output pad PADo through the resistor 68, especially when the potential of the output pad PADo becomes the external power supply voltage VTT (5 V) which is higher than the internal power supply voltage VDDIO (3.3 V), this potential of the output pad PADo may be directly impressed to the gate of the N-MOS transistor 22c, and it may be possible that the N-MOS transistor 22c may be damaged for not being able to endure the influence of the external power supply voltage VTT, as in the case of the above-described N-MOS transistor 67.

In order to resolve this problem, as shown in FIG. 1, the N-MOS transistor 21, which is kept constantly turned on, is connected between the output pad PADo and the clocked inverter 22. By this arrangement, the so-called Vt dropping will occur at the N-MOS transistor 21, and the potential impressed to the gate of the N-MOS transistor 22c will become equal to the gate potential of the N-MOS transistor 21 (the internal power supply voltage VDDIO in this case) from which the threshold voltage Vthn is subtracted, i.e. the potential impressed to the gate of the N-MOS transistor 22c will become VDDIO−Vthn, which is lower than the external voltage VTT impressed to the output pad PADo.

In this way, by having the N-MOS transistor 21, it becomes possible to prevent the potential of the output pad PADo from being directly impressed to the gate of the N-MOS transistor 22c, and therefore prevent the N-MQS transistor 22 from being damaged.

Furthermore, the clocked inverter 22 connected in the OE/PAD potential judging circuit 20 functions as a means to monitor the potential of the output pad PADo, as described above, and to operate the bias circuit 30 based on the monitoring result. As shown in FIG. 1, this clocked inverter 22 has a structure in which the P-MOS transistors 22a and 22b and the N-MOS transistors 22c and 22d are connected in series between the internal power supply voltage VDDIO and the ground.

In this embodiment, although the clocked inverter 22 has been described as having four transistors (i.e. two P-MOS transistors 22a and 22b and two N-MOS transistors 22c and 22d) being connected in series between the internal power supply voltage VDDIO and the ground, the present invention is not limited to this. According to the present invention, the clocked inverter 22 will do as long as it has a structure where there are three or more transistors including at least one P-MOS transistor and one N-MOS transistor connected in series between the internal power supply voltage VDDIO and the ground. In this case, the output of the two input NAND circuit 15 or the inverter 16 is connected to the gate of the transistors except for a pair of P-MOS transistor and N-MOS transistor which monitor the output pad PADo, and thereby a line between the internal power supply voltage VDDIO and the ground is shut off except during the period when the pulse signal oe5 or −oe5 is outputted.

In the clocked inverter 22, the gates of the P-MOS transistor 22b and the NMOS transistor 22c, of which drains are connected to each other, are connected to the output pad PADo via the N-MOS transistor 21 and the resistor 68. The source of the P-MOS transistor 22b is connected to the internal power supply voltage VDDIO via the P-MOS transistor 22a. The gate of the P-MO5 transistor 22a is connected to the output of the two-input NAND circuit 15 in the one-shot pulse generation circuit 10. In other words, the P-MOS transistor 22a will be turned on only when the pulse signal oe5 is inputted.

The source of the N-MOS transistor 22c is grounded via the N-MOS transistor 22d. The gate of the N-MOS transistor 22d is connected to the output of the inverter 16 in the one-shot pulse generation circuit 10. This means that the N-MOS transistor 22d will be turned on only when the pulse signal −oe5 is inputted.

By this structure, the clocked inverter 22 will operate only when the pulse signals oe5 and −oe5 are inputted and the internal power supply voltage VDDIO and the ground are connected, and thus monitor the potential of the output pad PADo. In this description, the time when the pulse signal oe5 is inputted/outputted indicates a period from the down edge to the up edge of the pulse signal oe5 shown in FIG. 2. Likewise, the time when the pulse signal −oe5 is inputted/outputted indicates a period from the up edge to the down edge of the pulse signal −oe5.

If the potential of the output pad PADo is at L level when the pulse signals oe5 and −oe5 are inputted, the clocked inverter 22 inputs the internal power supply voltage VDDIO to the other one of the two inputs of the two input NOR circuit 24 via the P-MOS transistors 22a and 22b. On the other hand, if the potential of the output pad PADo is at H level when the pulse signals oe5 and −oe5 are inputted, the clocked inverter 22 inputs the ground potential to the other one of the two inputs of the two input NOR circuit 24 via the N-MOS transistors 22c and 22d.

The output of the clocked inverter 22, i.e. the drains of the P-MOS transistor 22b and the N-MOS transistor 22c, is connected to the drain of the P-MOS transistor 23 and the other one of the two inputs of the two-input NOR circuit 24. The gate of the P-MO5 transistor 23 is connected to the output of the inverter 16 in the one-shot pulse generation circuit 10. Accordingly, the P-MOS transistor is turned on only when the pulse signal −oe5 is not inputted, and thereby it impresses the internal power supply voltage VDDIO to the other one of the two inputs of the two-input NOR circuit 24.

In this way, to the other one of the two inputs of the two-input NOR circuit 24 in the OE/PAD potential judging circuit 20, while the pulse signals oe5 and −oe5 are outputted, the output from the clocked inverter 22, i.e. the result of monitoring the output pad PADo, is inputted, and while the pulse signals oe5 and −oe5 are not outputted, the internal power supply voltage VDDIO is inputted. Therefore, the two-input NOR circuit 24 outputs H level during the period in which the pulse signals oe5 and −oe5 are outputted and the potential of the output pad PADo is at H level (i.e. the internal power supply voltage VDDIO or the external power supply voltage VTT, in this case), and other than this period, the two-input NOR circuit 24 outputs L level.

The output of the two-input NOR circuit 24 in the OE/PAD potential judging circuit 20 is connected to the gates of N-MOS transistors 31 and 32 in the bias circuit 30 (which will be described below), and the gates of a P-MOS transistor 34 and a P-MOS transistor 35a (which is one constituent of a transfer gate 35, which will be described below).

The output of the inverter 25, to which the output of the two-input NOR circuit 24 in the OE/PAD potential judging circuit 20 is inputted, is connected to the gates of N-MOS transistors 33e, 33f and 33g in the bias circuit 30, and the gate of a P-MOS transistor 35b in the transfer gate 35 in the bias circuit 30.

As described above, the bias circuit 30 receives two outputs, i.e. the output from the two-input NOR circuit 24 and the output from the inverter 25. This bias circuit 30 functions as a means to generate a bias voltage Vbias for controlling the P-MOS transistor 65 disposed in the output stage of the tristate output circuit 1 and impress this bias voltage Vbias to the gate of the P-MOS transistor 64, i.e. to a node pg (q.v. FIG. 1), during the period in which the pulse signals oe5 and −oeS are outputted from the one-shot pulse generation circuit 10. The P-MOS transistor 64 having its gate connected to the output of this bias circuit 30 functions as a means to control the potential of the node pg connected to the gate of the P-MOS transistor 65 based on the bias voltage Vbias received from the bias circuit 30 and thus pull the potential of the node pg up to the level of the potential of the output pad PADo.

As shown in FIG. 1, the bias circuit 30 includes N-MOS transistors 31, 32, and 33a to 33g, the P-MOS transistor 34, and the transfer gate 35. The P-MOS transistor 64 has its gate connected to the output of the bias circuit 30, i.e. to a node bias (q.v. FIG. 1), its drain connected to the output pad PADo via the resistor 68, and its source connected to the gate of the P-MOS transistor 65 via the node pg.

The N-MOS transistors 31 and 33a to 33d in the bias circuit 30 are serially connected in N stages (N=5 in FIG. 1) in between the internal power supply voltage VDDI and the ground. That is, the N-MOS transistor 31 has its source connected to the internal power supply voltage VDDIO and its drain connected to the drain of the N-MOS transistor 33a. The source of the N-MOS transistor 33a is connected to the drain of the N-MOS transistor 33b, the source of the N-MOS transistor 33b is connected to the drain of the N-MOS transistor 33c, and the source of the N-MOS transistor 33c is connected to the drain of the N-MOS transistor 33d. The gate of each of the N-MOS transistors 33a to 33c is connected to the drain of each of the N-MOS transistors 33a to 33c. The source and gate of the N-MOS transistor 33d are grounded.

In the following, the structure made up of the N-MOS transistors 31 and 33a to 33d is to be referred to as a vertical structure. In this vertical structure, the drains of the N-MOS transistors 31 and 33a function as output terminals.

The output terminals of the vertical structure in the bias circuit 30, i.e. the drain of the N-MOS transistor 31 and the drain and gate of the N-MOS transistor 33a, are also connected to the drain of the N-MOS transistor 33e. The N-MOS transistor 33e has its source grounded and its gate connected to the output of the inverter 25 in the OE/PAD potential judging circuit 20. The source of the N-MOS transistor 33a and the drain and gate of the N-MOS transistor 33b are connected to the drain of the N-MOS transistor 33f. The N-MOS transistor 33f has its source grounded and its gate connected to the output of the inverter 25 in the OE/PAD potential judging circuit 20. The source of the N-MO5 transistor 33b and the drain and gate of the N-MOS transistor 33c are connected to the drain of the N-MOS transistor 33g. The N-MOS transistor 33g has its source grounded and its gate connected to the output of the inverter 25 in the QE/PAD potential judging circuit 20.

In this structure, the N-MOS transistors 33e to 33g are controlled to be turned on or off on the basis of the output from the inverter 25 in the OE/PAD potential judging circuit 20. The N-MOS transistors 33a to 33d are controlled to be turned on or off in a way following the on or off turning of the N-MOS transistors 33e to 33g.

The output terminals of the vertical structure in the bias circuit 30, i.e. the drain of the N-MOS transistor 31 and the drain and gate of the N-MOS transistor 33a, are also connected to the source of the N-MOS transistor 32. The drain of the N-MOS transistor 32 is connected to the gate of the P-MOS transistor 64 via the node bias. The gate of the N-MOS transistor 32 is connected to the output of the two-input NOR circuit 24 in the OE/PAD potential judging circuit 20. The gate of the N-MOS transistor 31 in the vertical structure is also connected to the output of the two-input NOR circuit 24 in the OE/PAD potential judging circuit 20.

In addition, to the source of the N-MOS transistor 34 in the bias circuit 30, the internal power supply voltage VDDIO is impressed. The drain of the N-MOS transistor 34 is connected to the gate of the P-MOS transistor 64 via the transfer gate 35, which includes the P-MOS transistor 35a and the N-MOS transistor 35b, and the node bias.

To the gate of the P-MOS transistor 34 and the gate of the P-MOS transistor 35a in the transfer gate 35, the output of the two-input NOR circuit 24 in the OE/PAD potential judging circuit 20 is connected. To the gate of the N-MOS transistor 35b in the transfer gate 35, the output of the inverter 25 in the OE/PAD potential judging circuit 20.

In this structure, when L level is outputted from the two-input NOR circuit 24 while H level is outputted from the inverter 25, i.e. when the pulse signal −oe5 is not outputted and/or the potential of the output pad PADo is at L level, the P-MOS transistor 34, the transfer gate 35 and the N-MOS transistors 33e to 33g are turned on, and the N-MOS transistors 31, 32 and 33a to 33d are turned off. Thereby, the internal power supply voltage VDDIO having been impressed to the source of the P-MOS transistor 34 is impressed to the gate of the P-MO5 transistor 64 via the P-MOS transistor 34, the transfer gate 35 and the node bias.

On the other hand, when H level is outputted from the two-input NOR circuit 24 while L level is outputted from the inverter 25, i.e. when the pulse signals oe5 and −oe5 are outputted and the potential of the output pad PADo is at H level (i.e. the internal power supply voltage VDDIO or the external power supply voltage VTT), or in more concrete terms when the potential of the output pad PADo is at H level and the enable signal oe is changed to L level, the N-MOS transistors 31, 32 and 33a to 33d are turned on and the P-MOS transistor 34, the transfer gate 35 and the N-MOS transistors 33e to 33g are turned off. Thereby, the bias voltage Vbias is generated on the basis of the internal power supply voltage VDDIO having been impressed to the source of the P-MOS transistor 31, and this bias voltage Vbias is impressed to the gate of the P-MOS transistor 64 via the node bias.

However, the voltage having passed through the N-MOS transistors 31 and 32 in the bias circuit 30, i.e. the bias voltage Vbias outputted during the period in which the pulse signals oe5 and −oe5 are outputted and the potential of the output pad PADo is at H level (i.e. the internal power supply voltage VDDIO or the external power supply voltage VTT), will be decreased due to the threshold voltage Vthn of these N-MOS transistors 31 and 32. Accordingly, the bias voltage Vbias will become the voltage impressed to the source of the N-MOS transistor 31, i.e. the voltage obtained by subtracting the threshold voltage Vthn of the N-MOS transistors 31 and 32 from the internal power source voltage VDDIO (i.e. VDDIO−2Vthn). Therefore, to the gate of the P-MOS transistor 64, the bias voltage Vbias (i.e. VDDIO−2Vthn) which is lower than the internal power supply voltage VDDIO by twice the threshold voltage Vthn will be impressed via the node bias. Thereby, the P-MOS transistor 64 will be in a state that can pass electric current more smoothly. In other words, it becomes possible to increase the amount of current flowing into the P-MOS transistor 64. As a result, the potential of the node pg, i.e. the gate potential of the P-MOS transistor 65, can be immediately pulled up to the level of the external power supply voltage VTT impressed to the output pad PADo.

The floating well charging circuit 40 shown in FIG. 1 functions as a means to charge floating wells of the P-MOS transistors 51, 64 and 65 formed on a floating well substrate. As shown in FIG. 1, this floating well charging circuit 40 includes three P-MOS transistors 41, 42 and 43.

The gate of the P-MOS transistor 41 in the floating well charging circuit 40 is connected to the output pad PADo via the resistor 68. Therefore, to the gate of the P-MOS transistor 41, the potential of the output pad PADo is impressed. To the source of the P-MOS transistor 41, the internal power supply voltage VDDIO is impressed. To the drain of the P-MOS transistor 41, back gates (also called floating wells) of the P-MOS transistors 41, 42 and 43, and back gates of the P-MOS transistors 51 and 65 are connected.

The sources of the P-MOS transistors 42 and 43 in the floating well charging circuit 40 are connected to the output pad PADo via the resistor 68. To the gate of the P-MOS transistor 42, the internal power supply voltage VDDIO is impressed. On the other hand, the drain of the P-MOS transistor 42 is connected to the drains and back gates of the P-MOS transistors 41, 42 and 43, and the back gates of the P-MOS transistors 51 and 65. Therefore, to the gate of the P-MOS transistor 42, well potentials of the P-MOS transistors 41, 42, 43, 51, 64 and 65 are impressed.

In this structure, for instance, if the potential of the output bad PADo is at L level, the P-MOS transistor 41 in the floating well charging circuit 40 will be turned on and the electric charge will flow into the well from the internal power supply voltage VDDIO, by which the well potentials of the P-MOS transistors 41, 42, 43, 51 and 65 will be pulled up to VDDIO level. At this time, the internal power supply voltage VDDIO is impressed to the gate of the P-MOS transistor 42 in the floating well charging circuit 40, and since the well potential is fed back to the gate of the P-MOS transistor 43, there should be no current flowing out toward the output pad PADo through the P-MOS transistors 42 and 43. Then at the point when the well potential becomes VDDIO, the P-MOS transistor 41 will be turned off, and charging will be finished.

On the other hand, if, for instance, the potential of the output bad PADo is at H level (i.e. VDDIO level), the P-MOS transistor 41 in the floating well charging circuit 40 will be turned off while the P-MOS transistor 43 will be turned on instead, and the electric charge will flow into the well from the output pad PADo, by which the well potentials of the P-MOS transistors 41, 42, 43, 51 and 65 will be pulled up to VDDIO level. At this time, since the internal power supply voltage VDDIO is impressed to the gate of the P-MOS transistor 42 in the floating well charging circuit 40, there should be no current flowing out toward the output pad PADo through the P-MOS transistor 42. Then at the point when the well potential becomes VDDIO, the P-MOS transistors 41, 42 and 43 will all be turned off, and charging will be finished.

Moreover, if, for instance, the potential of the output bad PADo is at VTT level, which is higher than the internal power supply voltage VDDIO, the P-MOS transistor 41 in the floating well charging circuit 40 will be turned off while the P-MOS transistors 42 and 43 will be turned on instead, and the electric charge will flow into the well from the output pad PADo, by which the well potentials of the P-MOS transistors 41, 42, 43, 51, 64 and 65 will be pulled up. At this time, since the potential of the output pad PADo is impressed to the gate of the P-MOS transistor 41 via the resistor 68 and the drain of the P-MOS transistor 41 follows the uprise of the well potential, the P-MOS transistor 41 stays being turned off. Accordingly, there should be no current flowing out toward the power supply voltage VDDIO via the P-MOS transistor 41.

Then at the point when the well potential becomes VDDIO, the P-MOS transistor 42 will be turned off. However, since the P-MOS transistor 43, to which gate the well potential is fed back, is still being turned on, the floating well will be charged up to the potential of the output pad PADo (i.e. up to VTT). By operating in this way, no path by which current flows out to the internal power supply voltage VDDIO should be formed, and it should become possible to swiftly pull the well potential up to the level of the external power supply voltage VTT. Then at the point when the well potential becomes VDDIO, the P-MOS transistors 41, 42 and 43 in the floating well charging circuit 40 will all be turned off, and charging will be finished.

The transfer gate 50 shown in FIG. 1 functions as a means to lead or shut off connection between the output of the two-input NAND circuit 61 and the gate of the P-MOS transistor 65. As shown in FIG. 1, this transfer gate 50 includes a P-MOS transistor 51 and an N-MOS transistor 52.

The drain of the P-MOS transistor 51 and the source of the N-MOS transistor 52 are commonly connected to the output of the two-input NAND circuit 61. The source of the P-MOS transistor 51 and the drain of the N-MOS transistor 52 are connected to the source of the P-MOS transistor 64 and the gate of the P-MOS transistor 65. The P-MO5 transistor 51 has its gate connected to the output pad PADo via the resistor 68 and its back gate connected to the floating well charging circuit 40, as described above. To the gate of the P-MOS transistor 52, the internal power supply voltage VDDIO is impressed.

In this structure, for instance, if the input signal a is at H level and the enable signal oe is at H level, i.e. if the outputs of the two-input NAND circuit 61 and the two-input NOR circuit 63 are both at L level, the node pg (i.e. the gate of the P-MOS transistor 65) will become L level via the N-MOS transistor 52 in the transfer gate 50. At this time, the well potentials (back gate potentials) of the P-MOS transistors 51, 64 and 65 should be charged to VDDIO by the floating well charging circuit 40.

On the other hand, if, for instance, the input signal a is at L level and the enable signal oe is at H level, i.e. if the outputs of the two-input NAND circuit 61 and the two-input NOR circuit 63 are both at H level, the node pg (i.e. the gate of the P-MOS transistor 65) will become H level (i.e. VDDIO level) via the N-MOS transistor 51 in the transfer gate 50. At this time, the well potentials of the P-MOS transistors 51, 64 and 65 should be charged to VDDIO by the floating well charging circuit 40.

Moreover, if, for instance, the enable signal oe is at L level, i.e. if the output of the two-input NOR circuit 63 is at L level and the output of the two-input NAND circuit 61 is at H level, the output pad PADo should be under the indefinite state (i.e. the high impedance state), but at this time, if the output pad PADO is at VTT level which is higher than the internal power supply voltage VDDIO, the node pg (i.e. the gate of the P-MOS transistor 65) should be charged to VTT level. This is because the bias voltage Vbias is impressed to the gate of the P-MOS transistor 64 due to the bias circuit 30 operating on the basis of the pulse signals oe5 and −oe5 outputted from the one-shot pulse generation circuit 10 when the enable signal oe is changing into L level, and thereby current is made to flow from the output pad PADo to the node pg via the resistor 68 and the P-MOS transistor 64.

At this time, since the well potential of the P-MOS transistor 51 in the transfer gate 50 is at VTT, the P-MOS transistor 51 should be turned off at the point when the potential of the node pg becomes VTT. In addition, the well potential of the P-MOS transistor 64 should be charged to VTT by the floating well charging circuit 40.

In this way, since the well potential becomes VTT and the drain potential becomes VTT (i.e. the external power supply voltage VTT impressed to the output pad PADo), the P-MOS transistor 51 in the transfer gate 50 should be turned off at the point when the source potential, i.e. the potential of the node pg, becomes VTT.

In the above case, if the output pad PADo is at L level or VDDIO level, the node pg (i.e. the gate of the P-MOS transistor 65) should be charged to VDDIO level via the transfer gate 50 or the P-MOS transistor 64.

Operation

Now the operation of the tristate output circuit 1 according to the first embodiment of the present invention will be described. In the following, two particular cases are shown as examples. Case 1 shows the operation of the tristate output circuit 1 when the external power supply voltage VTT is impressed to the output pad PADo via a pull-up resistor (not shown) as the enable signal oe changes from H level to L level. Case 2 shows the operation of the tristate output circuit 1 when the output pad PADo becomes a middle potential while the enable signal oe is at L level. Note that the middle potential is not limited to half the potential of VDDIO. It is appropriate as long as it is a potential within the range that can have the P-MOS transistor (e.g. 22b in FIG. 1) and the NMOS transistor (e.g. 22c in FIG. 1), which monitor the potential of the output pad PADo, turned on at the same time.

Case 1

First, the operation of the tristate output circuit 1 when the external power supply voltage VTT is impressed to the output pad PADo via a pull-up resistor (not shown) as the enable signal oe changes from H level to L level will be described.

In the initial state of this operation, the enable signal oe is at H level. At this point, for instance, if the input signal a is at H level, the output of the two-input NAND circuit 61 should be at L level and the output of the two-input NOR circuit 63 should be at L level. Furthermore, if the potential of the output pad PADo is at H level (i.e. at VDDIO level), the two-input NOR circuit 24 in the OE/PAD potential judging circuit 20 will output L level, and the inverter 25 will output H level. Therefore, to the gate of the P-MOS transistor 64, the internal power supply voltage VDDIO from the bias circuit 30 will be impressed.

Here, the well potential of the P-MOS transistor 64 is pulled up to VDDIO level by the floating well charging circuit 40. Therefore, the P-MOS transistor 64 will be in a state of being turned off after having the source potential, i.e. the node pg, pulled up to VDDIO level.

At this point, when the enable signal oe changes from H level to L level, the output of the two-input NAND circuit 61 will become H level. Thereby, H level is impressed to the gate of the P-MOS transistor 65 via the transfer gate 50, and thus the output pad PADo will become under the indefinite state (i.e. the high impedance state). In this description of the operation, a case in which the external power supply voltage VTT is impressed to the output pad PADo via a pull-up resistor (not shown), at this point, will be shown as an example. That is, a case in which the potential of the output pad PADo becomes VTT will be shown.

When the above-mentioned enable signal oe changes from H level to L level, the one-shot pulse generation circuit 10 operates in a way described with reference to FIG. 2 to output the pulse signals oe5 and −oe5. Thereby, the OE/PAD potential judging circuit 20 operates temporarily to monitor the potential of the output pad PADo. In more concrete terms, since the potential of the output pad PADo is at VTT (>VDDIO), H level is outputted from the two-input NOR circuit 24 in the OE/PAD potential judging circuit 20 and L level is outputted from the inverter 25 while the pulse signals oe5 and −oe5 are outputted.

In this way, as H level is outputted from the two-input NOR circuit 24 in the OE/PAD potential judging circuit 20 and L level is outputted from the inverter 25, the N-MOS transistors 31 and 32 in the bias circuit 30 will be turned on. At this time, the N-MOS transistors 33a to 33d will also be turned on. Thereby, the bias voltage Vbias (i.e. VDDIO −2Vthn) which is lower than the internal power supply voltage VDDIO by twice the threshold voltage Vthn will be impressed to the node bias.

At this time, the well (i.e. the back gate) of the P-MOS transistor 64 is charged to VTT level via the floating well charging circuit 40. Therefore, the P-MOS transistor 64 having the bias voltage Vbias (i.e. VDDIO −2Vthn) which is lower than the internal power supply voltage VDDIO impressed to its gate will be in a state that can pass electric current more smoothly as compared with the case when the VDDIO is impressed to its gate. Accordingly, current will flow immediately to the node pg through the resistor 68 and the P-MOS transistor 64. Thereby, the potential of the node pg, i.e. the gate potential of the P-MOS transistor 65, can be immediately pulled up to VTT level. As a result, the gate potential, the back gate potential and the drain potential (corresponding to the potential of the output pad PADo) of the P-MOS transistor 65 will all become VTT, and the P-MOS transistor 65 will be turned off. Thereby, the current pass between the output pad PADo and the internal power supply voltage VDDIO will be shut off, and will become possible to prevent current from flowing from the output pad PADo to the internal power supply voltage VDDIO via the P-MOS transistor 65. This means that it is possible to prevent an increase in power consumption.

In addition, at the point when the potential of the node pg becomes VTT level, the source potential, the drain potential and the well potential of the P-MOS transistor 64 will all become VTT level, by which the P-MOS transistor 64 will be turned off.

After that, as a period of time, which corresponds with the predetermined time width of the pulse signals oe5 and −oe5, passes, i.e. as it becomes a state that pulse signals oe5 and −oe5 are not outputted, L level will be outputted from the output of the two-input NAND circuit 24 in the OE/PAD potential judging circuit 20 and H level will be outputted from the inverter 25, and thus the internal power supply voltage VDDIO will be outputted from the bias circuit 30. This internal power supply voltage VDDIO will be impressed to the gate of the P-MOS transistor 64. Accordingly, at this time, for instance, even if the potential of the output pad PADo becomes the middle potential, the P-MOS transistor 64 will stay being turned off. Thereby, it will become possible to prevent current from flowing from the internal power supply voltage VDDIO impressed to the two-input NAND circuit 61 toward the output pad PADo via the transfer gate 50, the P-MOS transistor 64 and the resistor 68. This means that it is possible to prevent an increase in power consumption.

Case 2

Next, the operation of the tristate output circuit 1 when the output pad PADo becomes a middle potential while the enable signal oe is at L level, will be described.

In this operation, since the output of the two-input NAND circuit 61 is at H level and the output of the two-input NOR circuit 63 is at L level, the output pad PADo is under the indefinite state (i.e. the high impedance state). In this description of the operation, a case in which the potential of the output pad PADo becomes half the potential of VDDIO (i.e. middle potential), at this point, will be shown as an example.

The middle potential impressed to the output pad PADo is impressed to the gates of the P-MOS transistor 22b and the N-MOS transistor 22c, which constitute the clocked inverter 22 in the OE/PAD potential judging circuit 20, via the resistor 68 and the N-MOS transistor 21 in the OE/PAD potential judging circuit 20. Thereby, the P-MOS transistor 22b and the N-MOS transistor 22c will be turned on at the same time.

In this embodiment, however, as described earlier, only when the enable signal oe is changing to L level the pulse signals oe5 and −oe5 are outputted from the one-shot pulse generation circuit 10 and the clocked inverter 22 is supposed to operate. Therefore, even when the P-MOS transistor 22b and the N-MOS transistor 22c are turned on at the same time due to the middle potential, the P-MOS transistor 22a and the N-MO5 transistor 22*d* will be turned off while the pulse signals oe5 and −oe5 are not outputted. Therefore, in this period, there will be no through current passing between the internal power supply voltage VDDIO and the ground via the clocked inverter 22, i.e. the P-MOS transistors 22*a* and 22*b* and the P-MOS transistors 22*c* and 22*d*. Thereby an increase in power consumption can be prevented.

In addition, the middle potential as just mentioned is also impressed to the drain of the P-MO5 transistor 64 via the resistor 68. In this embodiment, however, while the pulse signals oe5 and −oe5 are not outputted, the internal power supply voltage VDDIO outputted from the bias circuit 30 is supposed to be impressed to the gate of the P-MOS transistor 64. Moreover, at this time, the floating well charging circuit 40 is supposed to charge the well of the P-MOS transistor 64 up to the internal power supply voltage VDDIO. Therefore, even when the middle potential is impressed to the drain of the P-MOS transistor 64, the P-MOS transistor 64 will not be turned on and as a result, no DC current will flow into the output pad PADo via the P-MOS transistor 64 and the resistor 68. Thereby an increase in power consumption can be prevented.

As described above, according to the first embodiment of the present invention, the one-shot pulse generation circuit 10 is connected between the input terminal OF and one of the two inputs of the two-input NOR circuit 24, which is the input of the OE/PAD potential judging circuit 20, and when the potential of the output pad PADo becomes higher than the internal power supply voltage VDDIO (i.e. when it becomes VTT) while the pulse signals oe5 and −oe5 are outputted from this one-shot pulse generation circuit 10, the bias circuit 30 operates to have a voltage (i.e. bias voltage Vbias=VDDIO −2Vthn) which is lower than the internal power supply voltage VDDIO impressed to the gate of the P-MOS transistor 64. With this structure, when the enable signal oe changes to L level, the gate potential of the P-MOS transistor 65 connected between the output pad PADo and the internal power supply voltage VDDIO can be immediately pulled up to the level of the external power supply voltage VTT through the resistor 68 and the P-MOS transistor 64. Thereby, it is possible to prevent current from flowing from the output pad PADo to the side of the internal power supply voltage VDDIO via the P-MOS transistor 65 at the time of pull-up, and therefore, it is possible to prevent an increase in power consumption.

Furthermore, in this embodiment of the present invention, the bias circuit 30 operates only while the pulse signals oe5 and −oe5 are outputted from the one-shot pulse generation circuit 10. That is, in this period, the bias voltage Vbias (=VDDIO −2Vthn) for allowing the P-MOS transistor 64 to let current pass more smoothly is impressed to the gate of the P-MOS transistor 64 by the bias circuit 30, and when the pulse signals oe5 and −oe5 are not outputted from the one-shot pulse generation circuit 10, the internal power supply voltage VDDIO is impressed to the gate of the P-MOS transistor 64. With this structure, even when the potential of the output pad PADo becomes the middle potential for instance, after the output pad PADo turned to the indefinite state, as long as it is within the period in which the pulse signals oe5 and −oe5 are not outputted, the P-MOS transistor 64 to which gate the internal power supply voltage VDDIO is impressed will not be turned on. Therefore, even in such circumstances, it is possible to prevent a current pass from being formed between the internal power supply voltage VODIO to the output pad PADo via the two-input NAND circuit 61, the transfer gate 50, P-MOS transistor 64 and the resistor 68. In other words, it is possible to prevent current from flowing out to the output pad PADo. As a result, an increase in power consumption can be prevented.

In addition, according to this embodiment of the present invention, the OE/PAD potential judging circuit 20 uses the clocked inverter 22 which operates only while the pulse signals oe5 and −oe5 are outputted from the one-shot pulse generation circuit 10 to monitor the potential of the output pad PADo. With this structure, even when the potential of the output pad PADo becomes the middle potential for instance, there will be no through current passing between the internal power supply voltage VDDIO and the ground via the clocked inverter 22. Thereby, an increase in power consumption can be prevented.

Furthermore, according to this embodiment of the present invention, the N-MOS transistor 66 and the N-MOS transistor 21 for allowing Vt dropping to occur are connected between the output pad PADo and the N-MOS transistor 67 and between the output pad PADo and the gate of the clocked inverter 22, respectively. With this structure, even when the potential of the output pad PADo becomes the external power supply voltage VTT which is higher than the internal power supply voltage VDDIO, the N-MOS transistor 67 which drives the potential of the output pad PADo and the clocked inverter 22 which monitors the potential of the output pad PADo will not be damaged.

Second Embodiment

Next, a second embodiment of the present invention will be described with reference to the drawings. In the following, as for the structure that are the same as the first embodiment, the same reference numbers will be used, and redundant explanations of those structure elements will be omitted.

In this embodiment, a tristate output circuit 2 which has a structure of another tristate output circuit 1 of the first embodiment of the present invention will be described.

Structure

Figure 3:
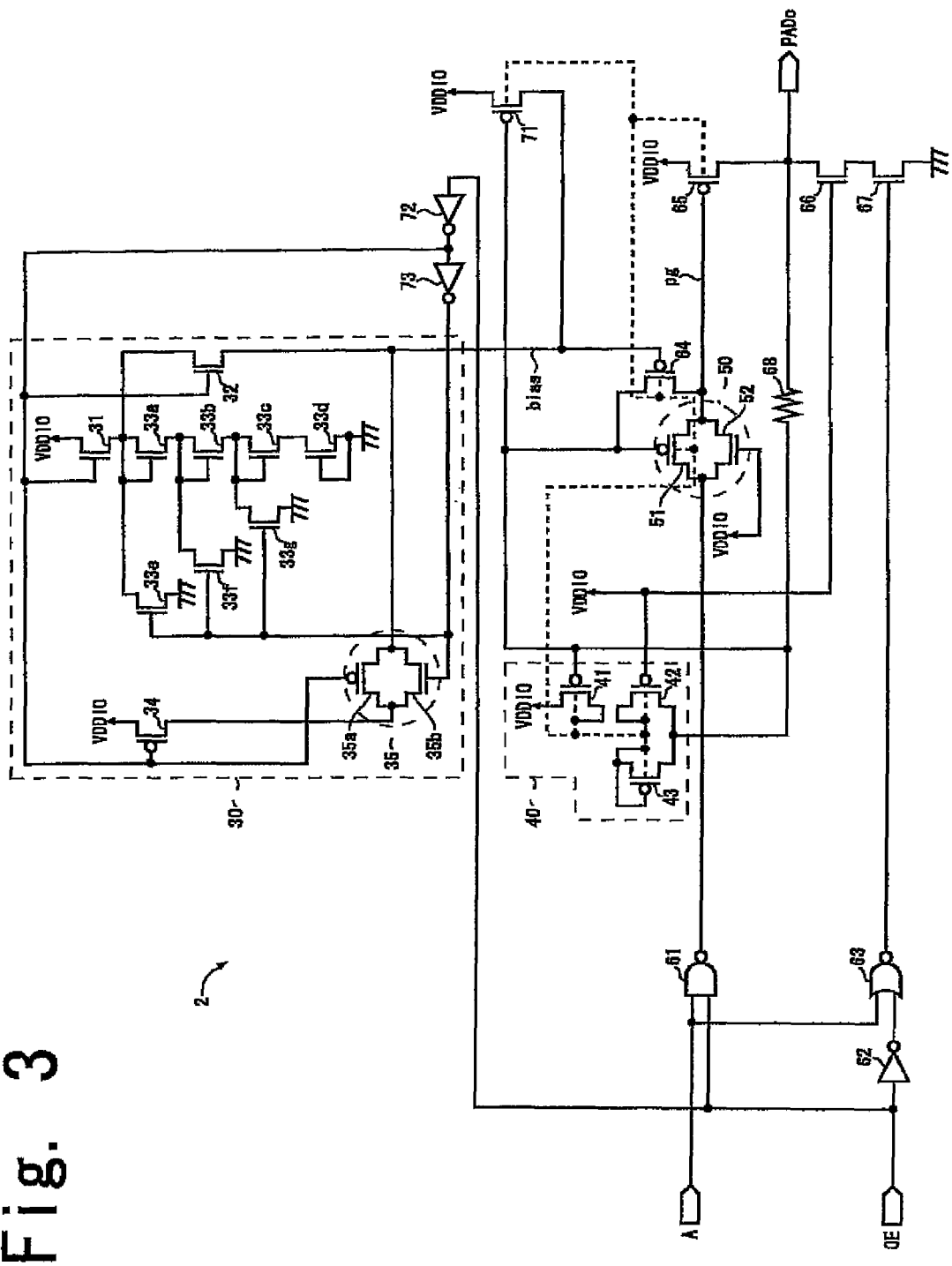
FIG. 3 is a circuit diagram showing a structure of a tristate output circuit 2 according to a second embodiment of the present invention.

FIG. 3 is a circuit diagram showing a structure of a tristate output circuit 2 according to the second embodiment of the present invention. As shown in FIG. 3, the tristate output circuit 2 has a bias circuit 30, a floating well charging circuit 40, a transfer gate 50, a two-input NAND circuit 61, inverters 62, 72 and 73, a two-input NOR circuit 63, a P-MOS transistor 64 (second transistor), a P-MOS transistor 65 (first transistor), a P-MOS transistor 71 (third transistor), an N-MOS transistor 66 (fourth transistor), an N-MOS transistor 67 (fifth transistor), and a resistor 68. In this tristate output circuit 2, an input signal a inputted to an input terminal A is outputted to an output pad PADo (output terminal). In addition, as in the first embodiment, the tristate output circuit 2 includes a structure which authorizes or unauthorizes output based on an output enable signal oe.

The bias circuit 30, the floating well charging circuit 40, the transfer gate 50, the two-input NAND circuit 61, the inverter 62, the two-input NOR circuit 63, the P-MOS transistors 64 and 65, the N-MOS transistors 66 and 67, and the resistor 68 are the same as in the structure of the tristate output circuit 1 according to the first embodiment of the present invention, and redundant explanations thereof will be omitted.

In the tristate output circuit 2, the one-shot pulse generation circuit 10 of the tristate output circuit 1 in the first embodiment is removed, the P-MOS transistor 71 having its gate connected to the output pad PADo through the resistor 68 is added, and the OE/PAD potential judging circuit 20 is replaced with the two inverters 72 and 73 connected in series.

In the above structure, the bias circuit 30 operates based on outputs of the inverters 72 and 73. In other words, the bias circuit 30 generates a bias voltage Vbias for controlling the P-MOS transistor 64 based on a signal level of the enable signal oe, and impresses this bias voltage to the gate of the P-MOS transistor 64.

Specifically, when the enable signal oe is at H level, i.e. in the state that the output is authorized, the inverter 72 outputs L level and the inverter 73 outputs H level. The output of the inverter 72 is connected to the gates of the N-MOS transistors 31 and 32 in the bias circuit 30, the gate of the P-MOS transistor 34, and the gate of the P-MOS transistor 35a in the transfer gate 35, respectively. The output of the inverter 73 is connected to the gates of the N-MOS transistors 33e to 33g in the bias circuit 30 and the gate of the N-MOS transistor 35b in the transfer gate 35, respectively.

Accordingly, in the state that the output is authorized, as in the state that the two-input NOR circuit 24 outputs L level and the inverter 25 outputs H level in the first embodiment, the N-MOS transistors 31 and 32 in the bias circuit 30 are turned off and the P-MOS transistor 34 and the transfer gate 35 in the bias circuit 30 are turned on. Thereby, the internal power supply voltage VDDIO is impressed to the node bias. At this time, the N-MOS transistors 33e to 33g are in the state of being turned on. Therefore, the N-MOS transistors 33a to 33d are in the state of being turned off.

On the other hand, when the enable signal oe is at L level, i.e. in the state that the output is unauthorized, the inverter 72 outputs N level and the inverter 73 outputs L level. Accordingly, in this state, as in the state that the two-input NOR circuit 24 outputs H level and the inverter 25 outputs L level in the first embodiment, the P-MOS transistor 34 and the transfer gate 35 in the bias circuit 30 are turned off and the N-MOS transistors 31, 32 and 33a to 33d are turned on. Thereby, the bias voltage Vbias (=VDDIO −2Vthn) which is lower than the internal power supply voltage VDDIO by twice of the threshold voltage Vthn is impressed to the node bias.

In this way, according to this embodiment, while the enable signal oe is at L level, the bias circuit 30 continues to operate.

Moreover, the P-MOS transistor 71 in the tristate output circuit 2 switches the potential of the node bias based on the potential of the output pad PADo. In the other words, the P-MOS transistor 71 functions as a switch for switching the potential impressed to the gate of the P-MOS transistor 64 to either the bias voltage Vbias or the internal power supply voltage VDDIO, based on the potential of the output pad PADo.

The drain of the P-MOS transistor 71 is connected to the internal power supply voltage VDDIO, and the source of the P-MOS transistor 71 is connected to the node bias, i.e. the gate of the P-MOS transistor 64. The gate of the P-MOS transistor 71 is, as mentioned above, connected to the output PADo through the resistor 68.

Furthermore, the back gate (also called the floating well) of the P-MOS transistor 71 is connected to the output of the floating well charging circuit 40. In other words, when the potential of the output pad PADo is below the internal power supply voltage VDDIO, the well potential of the P-MOS transistor 71 is charged to the level of VDDIO, and when the potential of the output PADo is higher than the internal power supply voltage VDDIO, e.g. the potential of the output pad PADo is the external power supply voltage VTT, the well potential of the P-MOS transistor 71 is charged to the level of VTT.

Accordingly, the P-MOS transistor 71 impresses the internal power supply voltage VDDIO to the node bias while the potential of the output pad PADo is lower than the internal power supply voltage VDDIO. On the other hand, the P-MOS transistor 71 turns off while the potential of the output pad PADo is higher than the internal power supply voltage VDDIO.

On the basis of the above factor, i.e. on the basis of the output of the bias circuit 30 and the output of the P-MOS transistor 71, in this embodiment, the potential of the node bias becomes at the bias voltage Vbias (=VDDIO −2Vthn) which is lower than the internal power supply voltage VDDIO while the enable signal oe is at L level and the potential of the output pad PADo is higher than the internal power supply voltage VDDIO. In a period other than this, i.e. while the enable signal oe is at H level and/or the potential of the output pad PADo is lower than the internal power supply voltage VDDIO, the potential of the node bias becomes at the internal power supply voltage VDDIO.

Operation

Now the operation of the tristate output circuit 2 according to the second embodiment of the present invention will be described. In the following, two particular cases are shown as examples. Case 1 shows the operation of the tristate output circuit 2 when the external power supply voltage VTT is impressed to the output pad PADo via a pull-up resistor (not shown) as the enable signal oe changes from H level to L level. Case 2 shows the operation of the tristate output circuit 2 when the output pad PADo becomes a middle potential while the enable signal oe is at L level.

Case 1

First, the operation of the tristate output circuit 2 when the external power supply voltage VTT is impressed to the output pad PADo via a pull-up resistor (not shown) as the enable signal oe changes from H level to L level will be described.

In the initial state of this operation, the inverter 72 outputs L level, and the inverter 73 outputs H level. Therefore, the internal power supply voltage outputted from the bias circuit 30 is impressed to the gate of the P-MOS transistor 64.

Here, the well, potential of the P-MOS transistor 64 is pulled up to VDDIO level by the floating well charging circuit 40. Therefore, the P-MOS transistor 64 will be in a state of being turned off after having the source potential, i.e. the node pg, pulled up to VDDIO level.

At this point, when the enable signal oe changes from H level to L level, the output of the two-input NAND circuit 61 will become H level. Thereby, H level is impressed to the gate of the P-MOS transistor 65 via the transfer gate 50, and thus the output pad PAD0 will become under the indefinite state (i.e. the high impedance state). In this description of the operation, a case in which the external power supply voltage VTT is impressed to the output pad PADo via a pull-up resistor (not shown), at this point, will be shown as an example. That is, a case in which the potential of the output pad PADo becomes VTT will be shown.

As mentioned above, when the enable signal oe changes from H level to L level, the inverter 72 outputs H level and the inverter 73 outputs L level.

In this way, as H level is outputted from the inverter 72 and L level is outputted from the inverter 73, the N-MOS transistors 31 and 32 in the bias circuit 30 will be turned on. At this time, the N-MOS transistors 33a to 33d will also be turned on. Thereby, the bias voltage Vbias (i.e. VDDIO −2Vthn) which is lower than the internal power supply voltage VDDIO by twice the threshold voltage Vthn will be impressed to the node bias.

Moreover, since the external power supply voltage VTT is impressed to the gate of the P-MOS transistor 71 and the floating well (back gate) is charged to the VTT level, the P-MOS transistor turns off. Accordingly, the potential of the node bias becomes the bias voltage Vbias (=VDDIO −2Vthn).

At this time, the well (i.e. the back gate) of the P-MOS transistor 64 is charged to VTT level via the floating well charging circuit 40. Therefore, the P-MOS transistor 64 having the bias voltage Vbias (i.e. VDDIO −2Vthn) which is lower than the internal power supply voltage VDDIO impressed to its gate will be in a state that can pass electric current more smoothly as compared with the case when the VDDIO is impressed to its gate. Accordingly, current will flow immediately to the node pg through the resistor 68 and the P-MOS transistor 64. Thereby, the potential of the node pg, i.e. the gate potential of the P-MOS transistor 65, can be immediately pulled up to VTT level. As a result, the gate potential, the back gate potential and the drain potential (corresponding to the potential of the output pad PAD0) of the P-MOS transistor 65 will all become VTT, and the P-MOS transistor 65 will be turned off. Thereby, the current pass between the output pad PADo and the internal power supply voltage VDDIO will be shut off, and will become possible to prevent current from flowing from the output pad PADo to the internal power supply voltage VDDIO via the P-MOS transistor 65. This means that it is possible to prevent an increase in power consumption.

In addition, at the point when the potential of the node pg becomes VTT level, the source potential, the drain, potential and the well potential of the P-MOS transistor 64 will all become VTT level, by which the P-MOS transistor 64 will be turned off.

After that, for instance, when the potential of the output pad PADo, becomes the middle potential, the P-MOS transistor 71 turns on. Thereby, the internal power supply voltage VDDIO is impressed to the node bias, i.e. the gate of the P-MOS transistor 64. Accordingly, as mentioned above, even if the potential of the output pad PADo becomes the middle potential, the P-MOS transistor 64 will stay being turned off. Thereby, it will become possible to prevent current from flowing from the internal power supply voltage VDDIO impressed to the two-input NAND circuit 61 toward the output pad PADo via the transfer gate 50, the P-MOS transistor 64 and the resistor 68. This means that it is possible to prevent an increase in power consumption.

Case 2

Next, the operation of the tristate output circuit 2 when the output pad PADo becomes a middle potential while the enable signal oe is at L level, will be described.

In this operation, since the output of the two-input NAND circuit 61 is at H level and the output of the two-input NOR circuit 63 is at L level, the output pad PADo is under the indefinite state (i.e. the high impedance state). In this description of the operation, a case in which the potential of the output pad PADo becomes the middle potential, at this point, will be shown as an example.

The middle potential impressed to the output pad PADo is impressed to the gates of the P-MOS transistor 71 via the resistor 68. At this time, since the well potential of the P-MOS transistor 71 is pulled up to VDDIO level by the floating well charging circuit 40, the P-MOS transistor 64 is being turned on. Thereby, the internal power supply voltage VDDIO will be impressed to the node bias, i.e. the gate of the P-MOS transistor 64.

At this time, the floating well charging circuit 40 is supposed to charge the well of the P-MOS transistor 64 up to the internal power supply voltage VDDIO. Therefore, even when the middle potential is impressed to the drain of the P-MOS transistor 64, the P-MOS transistor 64 will not be turned on, and as a result, no DC current will flow into the output pad PADo via the P-MOS transistor 64 and the resistor 68. Thereby, an increase in power consumption can be prevented.

As described above, according to the second embodiment of the present invention, when the potential of the output pad PADo becomes higher than the internal power supply voltage VDDIO (i.e. when it becomes VTT) while the enable signal oe is at L level, the bias circuit 30 operates to have a voltage (i.e. bias voltage Vbias=VDDIO −2Vthn) which is lower than the internal power supply voltage VDDIO impressed to the gate of the P-MOS transistor 64. With this structure, as in the first embodiment, when the enable signal oe changes to I level, the gate potential of the P-MOS transistor 65 connected between the output pad PADo and the internal power supply voltage VDDIO can be immediately pulled up to the level of the external power supply voltage VTT through the resistor 68 and the P-MOS transistor 64. Thereby, it is possible to prevent current from flowing from the output pad PADo to the side of the internal power supply voltage VDDIO via the P-MOS transistor 65 at the time of pull-up, and therefore, it is possible to prevent an increase in power consumption.

Furthermore, in this embodiment of the present invention, the bias circuit 30 operates only while the enable signal oe is at L level and the potential of the output pad PADo is higher than the internal power supply voltage VDDIO. That is, in this period, the bias voltage Vbias (=VDDIO−2Vthn) for allowing the P-MOS transistor 64 to let current pass more smoothly is outputted from the bias circuit 30, and when the enable signal oe is at H level and/or the potential of the output pad PADo is lower than the internal power supply voltage VDDIO, the internal power supply voltage VDDIO outputted from the bias circuit 30 or the P-MOS transistor 71 is impressed to the gate of the P-MOS transistor 64. With this structure, when the potential of the output pad PADo becomes the middle potential for instance, after the output pad PADo turned to the indefinite state, the internal power supply voltage VDDIO is impressed to the gate of the P-MOS transistor 64. Thereby, even when the potential of the output pad PADo becomes the middle potential for instance, after the output pad PADo turned to the indefinite state, the P-MOS transistor 64 will not be turned on. Therefore, even in such circumstances, it is possible to prevent a current pass from being formed between the internal power supply voltage VDDIO and the output pad PADo via the two-input NAND circuit 61, the transfer gate 50, P-MOS transistor 64 and the resistor 68. In other words, it is possible to prevent current from flowing out to the output pad PADo. As a result, an increase in power consumption can be prevented.

In addition, according to this embodiment of the present invention, the potential of the output pad PADo is received at the gate of the C-MOS (Complementary Metal Oxide Semiconductor) such as an inverter or the like. With this structure, even when the potential of the output pad PADo becomes the middle potential for instance, there will be no through current passing between the internal power supply voltage VDDIO and the ground via the C-MOS such as an inverter. Thereby, an increase in power consumption can be prevented.

Furthermore, according to this embodiment of the present invention, the N-MOS transistor 66 for allowing Vt dropping to occur is connected between the output pad PADo and the N-MOS transistor 67. With this structure, even when the potential of the output pad PADo becomes the external power supply voltage VTT which is higher than the internal power supply voltage VDDIO, the N-MOS transistor 67 which drives the potential of the output pad PADo will not be damaged.

In addition, according to this embodiment of the present invention, the tristate output circuit which realizes the above effects is realizable with a small number of circuit elements. For instance, the tristate output circuit 2 according to this embodiment realizes the same effect as the tristate output circuit 1 in the first embodiment with a smaller number of circuit elements.

Third Embodiment

Next; a third embodiment of the present invention will be described with reference to the drawings. In the following, as for the structure that are the same as the first embodiment or the second embodiment, the same reference numbers will be used, and redundant explanations of those structure elements will be omitted.

In this embodiment, a tolerant input circuit 3 which is an input interface (it is also an input/output circuit) constituted using the circuit structure of the tristate output circuit 2 according to the second embodiment of the present invention will be described.

Structure

Figure 4:
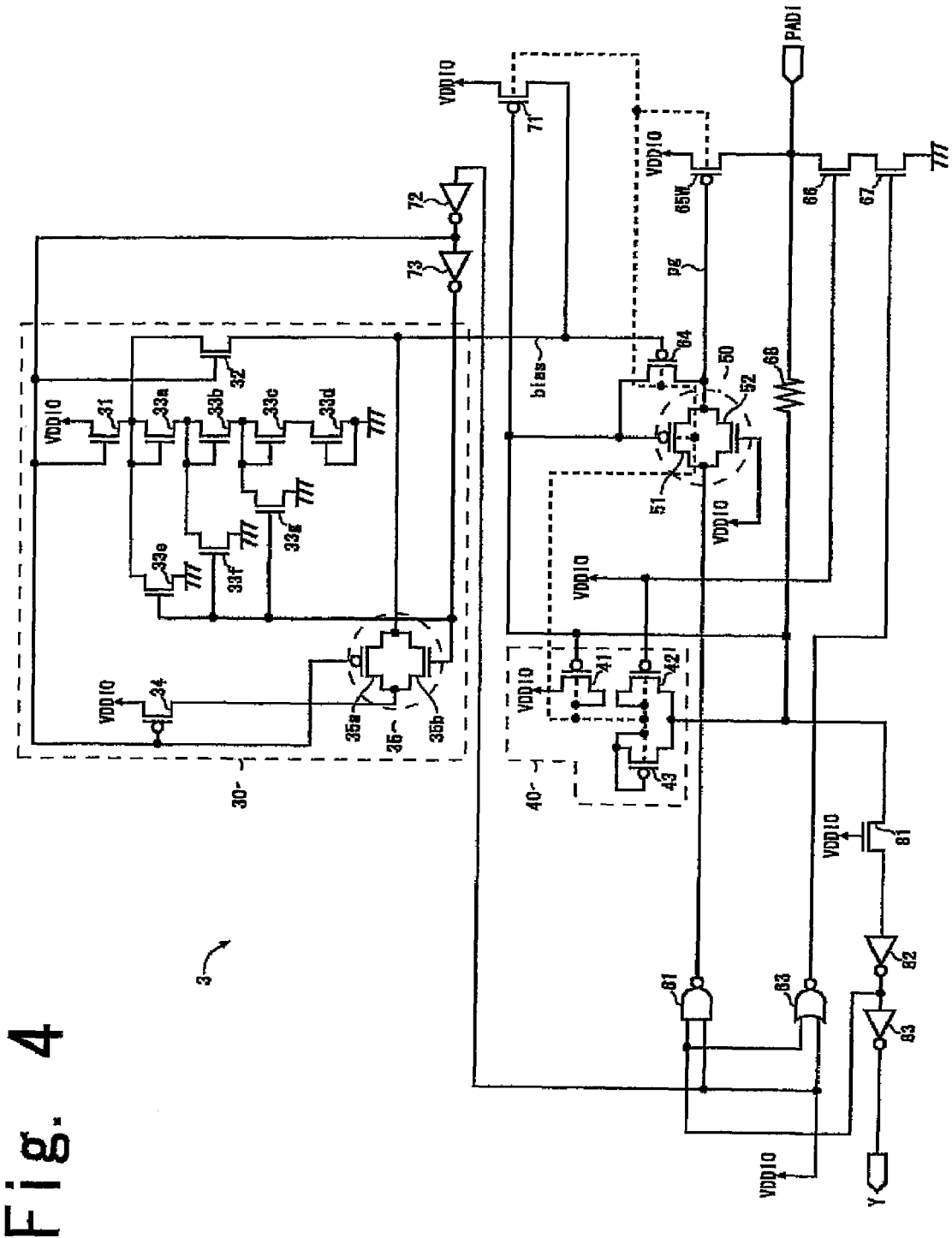
FIG. 4 is a circuit diagram showing a structure of a tristate output circuit 3 according to a third embodiment of the present invention.

FIG. 4 is a circuit diagram showing a structure of a tolerant input circuit 3 according to the third embodiment of the present invention. As shown in FIG. 4, the tolerant input circuit 3 has a bias circuit 30, a floating well charging circuit 40, a transfer gate 50, a two-input NAND circuit 61, inverters 72, 73, 82 and 83, a two-input NOR circuit 63, a P-MOS transistor 64 (second transistor), a P-MOS transistor 65W (first transistor), a P-MOS transistor 71, an N-MOS transistor 66 (fourth transistor), an N-MOS transistor 67 (fifth transistor), an N-MOS transistor 81 (third transistor), and a resistor 68. In this tolerant input circuit 3, an input signal pad inputted to an input pad PADi (input terminal) is outputted to an output terminal Y.

The inverters 72 and 73, the bias circuit 30, the floating well charging circuit 40, the transfer gate 50 are the same as in the structure of the tristate output circuit 2 according to the second embodiment of the present invention.

More specifically, as in the case of the second embodiment, the bias circuit 30 in this embodiment has the N-MOS transistors 31, 32 and 33a to 33g, the P-MOS transistor 34 and the transfer gate 35. With this structure, the bias circuit 30 impresses the bias voltage Vbias to the node bias based on the potential outputted from the inverters 72 and 73. In addition, in this embodiment, the input of the inverter 72 is connected to the internal power supply voltage VDDIO instead of the input terminal OE (shown in FIG. 1 or 3). Thereby, in this embodiment, the inverter 72 constantly outputs L level and the inverter 72 constantly outputs H level. Accordingly, the bias circuit 30 constantly impresses the internal power supply voltage VDDIO to the node bias, i.e. the gate of the P-MOS transistor 64.

As the second embodiment, the floating well charging circuit 40 has three P-MOS transistor 41 to 43, and charges the back gates of the P-MOS transistors 64, 65W and 71 to VDDIO level or VTT level (>VDDIO level) which is the voltage level of the external power supply voltage VU impressed to the input pad PADi.

As in the case of the second embodiment, in this embodiment, the transfer gate 50 has the P-MOS transistor 51 and the N-MOS transistor 52, and connects/disconnects between the output of the two-input NAND circuit 61 and the gate of the P-MOS transistor 65W based on the potential of the input pad PADi.

The rest structure of the tolerant input circuit 3 will be described now. In the tolerant input circuit 3 according to this embodiment, as shown in FIG. 4, one input of the two-input NAND circuit 61 is connected to the internal power supply voltage VDDIO instead of the input terminal A (shown in FIG. 1 or 3). The other input of the two-input NAND circuit 61 is connected to the output of the inverter 82 which will described below. Thereby, the two-input NAND circuit 61 outputs L level only while the output of the inverter 82 is at H level.

Furthermore, in the tolerant input circuit 3, the inverter 62 of the tristate output circuit 1 or 2 is removed, and one input of the two-input NAND circuit 63 is connected to the internal power supply voltage VDDIO instead of the output of the inverter 62 (shown in FIG. 1 or 3). The other input of the two-input NAND circuit 63 is connected to the inverter 82 which will be described below, as in the case of the two-input NAND circuit 61. However, since one input of the two-input NAND circuit 63 is connected to the internal power supply voltage VDDIO, the two-input NAND circuit 63 constantly outputs L level.

As in the case of the first or second embodiment, in this embodiment, the output of the two-input NAND circuit 61 is connected to the gate of the P-MOS transistor 65W for driving the input pad PADi via the transfer gate 50.

The P-MOS transistor 65W corresponds to the P-MOS transistor 65 in the first or second embodiment In addition, in this embodiment, the gate width of the P-MOS transistor 65W is narrower than the gate width of the P-MOS transistor 65 adopted in the first or second embodiment. Likewise, the gate length of the P-MOS transistor 65W is longer than the gate length of the P-MOS transistor 65 adopted in the first or second embodiment.

The gate width being narrow indicates that the P-MOS transistor's ability of passing current (i.e. a driving force) is low as compared with the case in which the gate width is wide (in the case in which the same gate potential is used). The gate length being long indicates that the P-MOS transistors driving force is low as compared with the case in which the gate length is short. That is, in this embodiment, a P-MOS transistor 65W with a comparatively low driving force is used.

By using such P-MOS transistor 65W, it is possible to connect a comparatively large load between the internal power supply voltage VDDIO and the input pad PADi. Therefore, it is possible to reduce the amount of current flowing from the input pad PADI to the internal power supply voltage VDDIO via P-MOS transistor 65W and from the internal power supply voltage VDDIO to the input pad PADi via P-MOS transistor 65W.

The two-input NOR circuit 6 is connected to the gate of the N-MOS transistor 67 for driving the input pad PADi, as in the case of the first or second embodiment.

In addition, as shown in FIG. 4, the input pad PADi is connected to the input of the inverter 82 via the N-MOS transistor 81. In other words, the inverter 82 is connected between the input pad PADi and the output terminal Y.

The internal power supply voltage VDDIO is constantly impressed to the gate of the N-MOS transistor 81 connected between the input pad PADi and the inverter 82. That is, the N-MOS transistor 81 is constantly being turned on. This N-MOS transistor 81 is a protective element especially for N-MOS transistors of the inverter 82 which is provided in the subsequent stage of the N-MOS transistor 82. In other words, the N-MOS transistor 82 is a circuit element for realizing the function that enable the impression of the external power supply voltage VTT among other tolerant functions in this embodiment.

Although the inverter 82 monitors the potential of the input pad PADi through the resistor 68, especially when the potential of the input pad PADi becomes the external power supply voltage VTT (5 V) which is higher than the internal power supply voltage VDDIO (3.3 V), this potential of the input pad PADi may be directly impressed to the gate of the N-MOS transistor of the inverter 82, and it may be possible that the N-MOS transistor may be damaged for not being able to endure the influence of the external power supply voltage VTT as in the case of the above described N-MOS transistors 67 and 22c.

In order to resolve this problem, as shown in FIG. 4, the N-MOS transistor 81, which is kept constantly turned on, is connected between the input pad PADI and inverter 82. By this arrangement, Vt dropping will occur at the N-MOS transistor 81, and the potential impressed to the gate of the N-MOS transistor of the inverter 82 will become lower than the external voltage VTT impressed to the input pad PADi.

In this way, by having the N-MOS transistor 81, it becomes possible to prevent the potential of the input pad PADi from being directly impressed to the gate of the N-MOS transistor of the inverter 82, and therefore prevent the inverter 82, especially the N-MOS transistor, from being damaged.

As mentioned above, the output of the inverter 82 connected in the output stage of the N-MOS transistor 81 is connected to the other input of the two-input NAND circuit 61 and the other input of the two-input NOR circuit 63, respectively. Therefore, the two-input NAND circuit 61 outputs L level only when data inputted to the input pad PADi is at H level (e.g. data '1'). On the other hand, the two-input NOR circuit 62 outputs L level either when H level (e.g. data '1') is inputted to the input pad PADi or when L level (e.g. data '0') is inputted to the input pad PADI. Thereby, the N-MOS transistor 67 having its gate connected to the output of the two-input NOR circuit 63 is constantly being turned off.

Moreover, the output of the inverter 82, i.e. the data inputted to the input pad PADi, is outputted from the output terminal Y after being returned to the original data by passing the inverter 83.

Since the rest of the structure is the same as the first or the second embodiment detailed description thereof will be omitted.

Operation

Now the operation of the tolerant input circuit 3 according to the third embodiment of the present invention will be described. In the following, three particular cases are shown as examples. Case 1 shows the operation of the tolerant input circuit 3 when L level (e.g. data '0') is inputted to the input pad PADI. Case 2 shows the operation of the tolerant circuit 3 when H level (e.g. data '1') is inputted to the input pad PADi. Case 3 shows the operation of the tolerant circuit 3 when the external power supply voltage VTT which is higher than the internal power supply voltage VDDIO is inputted to the input pad PADi.

Case 1

First, the operation of the tolerant input circuit 3 when L level (e.g. data '0') is inputted to the input pad PADi will be described.

In this operation, L level is inputted to the inverter 82 via the resistor 68 and the N-MOS transistor 81. Therefore, the inverter 82 outputs H level, and the two-input NAND circuit 61 outputs L level. Thereby, L level is inputted to the gate of the P-MOS transistor 65W via the transfer gate 50, and the P-MOS transistor 65W is turned on. In addition, the output terminal V outputs the output of the inverter 82, i.e. L level.

At this point, as mentioned above, the P-MOS transistor 65W in this embodiment has the low driving force. Therefore, even if the input pad PADi becomes the high impedance state for instance, only a slight amount of current will flow through the P-MOS transistor 65W having the low driving force. Accordingly, only a slight amount of current flows from the internal power supply voltage VDDIO to the input pad PADi via the P-MOS transistor 65W, and thereby the input pad PADi can be slowly pulled up to the potential of the internal power supply voltage VDDIO.

Case 2

Next, the operation of the tolerant input circuit 3 when H level (e.g. data '1') is inputted to the input pad PADi will be described.

In this operation, H level is inputted to the inverter 82 via the resistor 68 and the N-MOS transistor 81. Therefore, the inverter 82 outputs L level, and the two-input NAND circuit 61 outputs H level. Thereby, H level is inputted to the gate of the P-MOS transistor 65W, and the P-MOS transistor 65W is turned off. In addition, the output terminal Y outputs the output of the inverter 82, i.e. H level.

Case 3

Next, the operation of the tolerant input circuit 3 when the external power supply voltage VDDIO is inputted to the input pad PADi will be described.

In this operation, H level is inputted to the inverter 82 via the resistor 68 and the N-MOS transistor 81. Therefore, the inverter 82 outputs L level, and the two-input NAND circuit 61 outputs H level. Thereby, H level is inputted to the gate of the P-MOS transistor 65W, and the P-MOS transistor 65W is turned off. In addition, the output terminal Y outputs the output of the inverter 83, i.e. H level.

Even in such case, by connecting the P-MOS transistor 65W having the low driving force between the internal power supply voltage VDDIO and the input pad PADi, a slight amount of current will flow through it. Therefore, since the gate and the floating well of the P-MOS transistor 65W are charged to VTT level, even if the external power supply voltage VTT which is higher than the internal power supply voltage VDDIO is impressed to the input pad PADi for instance, the P-MOS transistor 65W is kept turned off. Accordingly, the current does not flow from the input pad PADI to the side of the internal power supply voltage VDDIO via the P-MOS transistor 65W, and thereby an increase in power consumption can be prevented.

In addition, since the source potential, the drain potential and the well potential of the P-MOS transistor 64 are all at VTT level when the potential of the node pg becomes at VTT level, the P-MOS transistor 64 is turned off.

As described above, according to the third embodiment of the present invention, the P-MOS transistor 65W having the low driving force is connected between the internal power supply voltage VDDIO and the input pad PADi. With this structure, even if the input pad PADi becomes the high impedance state for instance, a slight amount of current will flow through the P-MOS transistor 65W having the low driving force. Therefore, only a slight amount of current flows from the internal power supply voltage VDDIO to the input pad PADi via P-MOS transistor 65W, and thereby the input pad PADi can be pulled up slowly to the potential of the internal power supply voltage VDDIO.

Moreover, according to the third embodiment of the present Invention, as mentioned above, the P-MOS transistor 65W having the low driving force is connected between the internal power supply voltage VDDIO and the input pad PADi. With this structure, only a slight amount of current will flow through the P-MOS transistor 65W. Therefore, since the gate and the floating well of the P-MOS transistor 65W are charged to VTT level, even if the external power supply voltage VTT which is higher than the internal power supply voltage VDDIO is impressed to the input pad PADi, the P-MOS transistor 65W is kept turned off. Accordingly, the current does not flow from the input pad PADI to the side of the internal power supply voltage VDDIO via the P-MOS transistor 65W, and thereby an increase in power consumption can be prevented.

Furthermore, according to the third embodiment of the present invention, the internal power supply voltage. VDDIO is impressed to the node bias, i.e. the gate of the P-MOS transistor 64, and thereby the P-MOS transistor 64 is kept turned off. With this structure, even if the potential of the input pad PADi becomes the middle potential after the external power supply voltage VTT which is higher than the internal power supply voltage VDDIO is impressed to the input pad PADi, the current does not flow from the internal power supply voltage VDDIO impressed to the two-input NAND circuit 61 to the input pad PADi via the transfer gate 50, the P-MOS transistor 64 and the resistor 68. Thereby, an increase in power consumption can be prevented.

In addition, according to this embodiment of the present invention, the tolerant input circuit which realizes the above effects can be realized with a smaller number of circuit elements.

Fourth Embodiment

Next, a fourth embodiment of the present invention will be described with reference to the drawings. In the following, as for the structure that are the same as the first, second or third embodiment, the same reference numbers will be used, and redundant explanations of those structure elements will be omitted.

In this embodiment an interactive circuit (it is also an input/output circuit) constructed from the tristate output circuit 1 according to the first embodiment of the present invention and the tolerant input circuit 3 according to the third embodiment of the present invention will be described.

Structure

Figure 5:
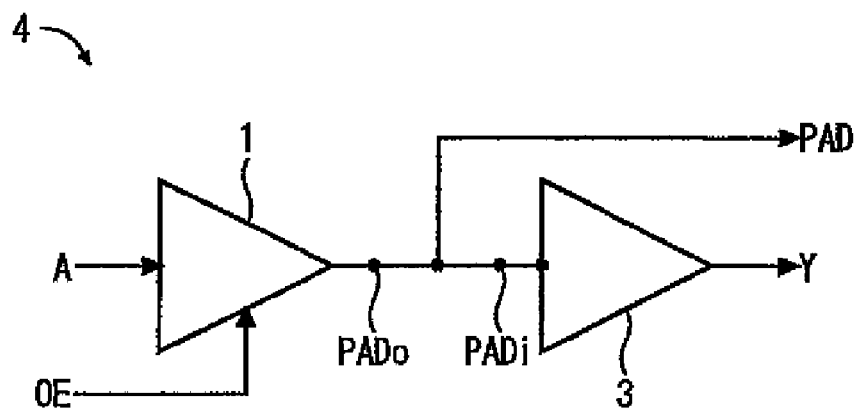
FIG. 5 is an equivalent circuit diagram showing a structure of a interactive circuit 4 according to a fourth embodiment of the present invention.

FIG. 5 is an equivalent circuit diagram showing a structure of an interactive circuit 4 according to the fourth embodiment of the present invention. As shown in FIG. 5, the interactive circuit 4 has the tristate output circuit 1 in the first embodiment and the tolerant input circuit 3 in the third embodiment. In the interactive circuit 4, the output pad PADo of the tristate output circuit 1 and the input pad PADi of the tolerant input circuit 3 are connected. In addition, the connection of the output pad PADo and the input pad PADi functions as an input/output pad PAD.

The structure of the tristate output circuit 1 is the same as in the case of the first embodiment. The structure of the tolerant input circuit 3 is the same as in the case of the third embodiment. Accordingly, the redundant explanations of those structure elements will be omitted.

Operation

The operation of the tristate output circuit 1 in this embodiment is the same as the first embodiment of the present invention, and redundant explanations of this operation will be omitted. In addition, when the tolerant input circuit 3. operates for instance, the enable signal oe is set to be at L level. Thereby, the operation of the tristate output circuit 1 and the operation of the tolerant input circuit 3 can be separated. Moreover, the operation of the tolerant input circuit 3 in this embodiment is the same as the third embodiment of the present invention, and redundant explanations of this operation will be omitted.

As described above, according to the fourth embodiment of the present invention, the tristate output circuit 1 according to the first embodiment of the present invention and the tolerant input circuit 3 according to the third, embodiment of the present invention is combined. With this structure, the interactive circuit 4 which realizes the effects of the tristate output circuit 1 and the tolerant input circuit 3 can be obtained.

Fifth Embodiment

Next, a fifth embodiment of the present invention will be described with reference to the drawings. In the following, as for the structure that are the same as the first, second, third or fourth embodiment, the same reference numbers will be used, and redundant explanations of those structure elements will be omitted.

In this embodiment, an interactive circuit (it is also an input/output circuit) constructed from the tristate output circuit 2 according to the second embodiment of the present invention and the tolerant input circuit 3 according to the third embodiment of the present invention will be described.

Structure

Figure 6:
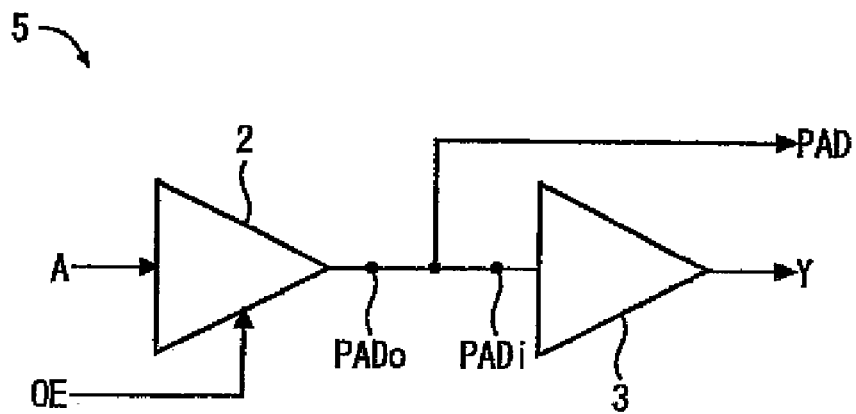
FIG. 6 is an equivalent circuit diagram showing a structure of a interactive circuit 5 according to a fifth embodiment of the present invention.

FIG. 6 is an equivalent circuit diagram showing a structure of an interactive circuit 5 according to the fifth embodiment of the present invention. As shown in FIG. 6, the interactive circuit 5 has the tristate output circuit 2 in the second embodiment and the tolerant input circuit 3 in the third embodiment. In the interactive circuit 5, the output pad PADo of the tristate output circuit 2 and the input pad PADi of the tolerant input circuit 3 are connected. In addition, the connection of the output pad PADo and the input pad PADi functions as an input/output pad PAD.

The structure of the tristate output circuit 2 is the same as in the case of the second embodiment. The structure of the tolerant input circuit 3 is the same as in the case of the third embodiment. Accordingly, the redundant explanations of those structure elements will be omitted.

Operation

The operation of the tristate output circuit 2 in this embodiment is the same as the second embodiment of the present invention, and redundant explanations of this operation will be omitted. In addition, when the tolerant input circuit 3 operates for instance, the enable signal oe is set to be at L level. Thereby, the operation of the tristate output circuit 2 and the operation of the tolerant input circuit 3 can be separated. Moreover, the operation of the tolerant input circuit 3 in this embodiment is the same as the third embodiment of the present invention, and redundant explanations of this operation will be omitted.

As described above, according to the fifth embodiment of the present invention, the tristate output circuit 2 according to the second embodiment of the present invention and the tolerant input circuit 3 according to the third embodiment of the present invention is combined. With this structure, the interactive circuit 4 which realizes the effects of the tristate output circuit 2 and the tolerant input circuit 3 can be obtained.

Sixth Embodiment

Next a sixth embodiment of the present invention will be described with reference to the drawings. In the following, as for the structure that are the same as the first, second, third, fourth or sixth embodiment, the same reference numbers will be used, and redundant explanations of those structure elements will be omitted.

Figure 7A:
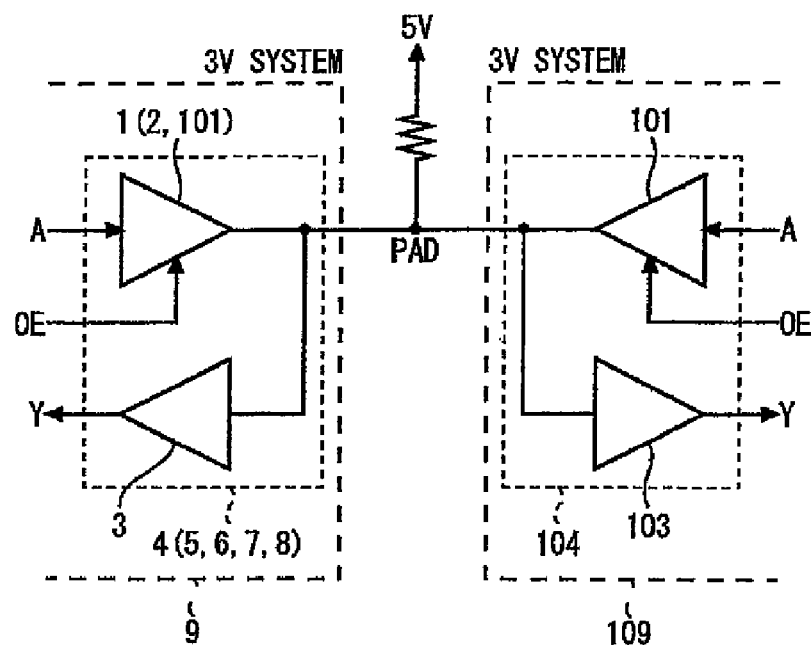
FIG. 7A and FIG. 7B are diagrams showing examples of how a semiconductor input/output device 9 according to a sixth embodiment of the present invention is used.
Figure 7B:
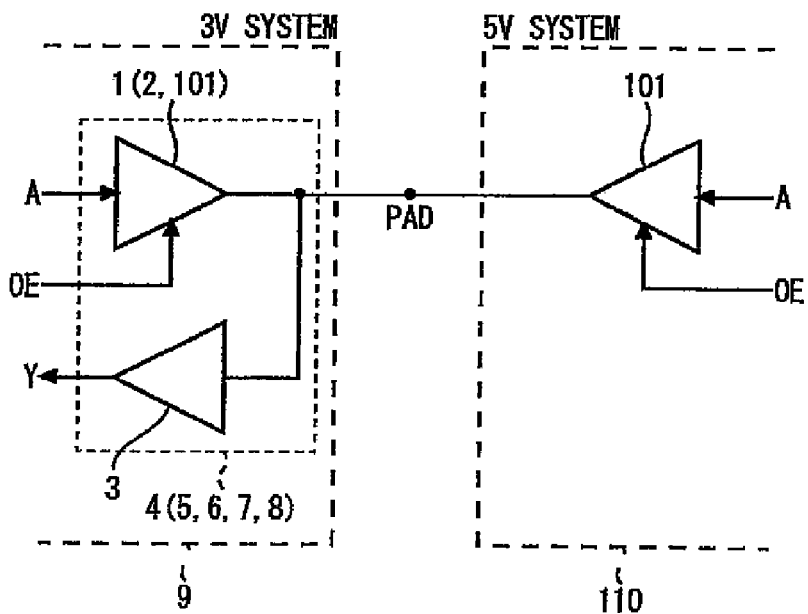

The interactive circuits 4 to 8 according to the fourth to sixth embodiments are mounted in the semiconductor input/output device 9 formed into 1 chip shown in FIGS. 7A and 7B. As shown in FIGS. 7A and 7B, the semiconductor input/output device 9 can be combined with a semiconductor input/output device 109 with which an interactive circuit 104 constructed from a conventional input circuit 101 and a conventional output circuit 103 is mounted or a semiconductor input/output device 110 with which a conventional input circuit 101 is mounted.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2004-339880. The entire disclosures of Japanese Patent Application No. 2004-339880 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. An input/output circuit comprising:
   an output terminal;
   a first transistor driving the output terminal based on a predetermined signal, the first transistor having a gate electrode, and first and second electrodes;
   a second transistor controlling a potential of the gate electrode of the first transistor, the second transistor having a gate electrode, and first and second electrodes;
   a bias circuit generating a bias voltage for controlling the second transistor based on a level of the predetermined signal, and impressing the bias voltage to the gate electrode of the second transistor; and
   a third transistor switching a voltage which is impressed to the gate electrode of the second transistor based on a potential of the output terminal, the third transistor having a gate electrode, and first and second electrodes,
   wherein the first electrode of the second transistor is electrically connected to the gate electrode of the first transistor, and the second electrode of the second transistor is electrically connected to the output terminal and the second electrode of the first transistor through a resistor, and to the gate electrode of the third transistor, and
   wherein the gate electrode of the second transistor is connected to the bias circuit and the second electrode of the third transistor.

2. The input/output circuit according to claim 1, wherein the first and second transistors are p-type transistors, and a level of the bias voltage is lower than an operational potential of the input/output circuit.

3. The input/output circuit according to claim 1, wherein the first and second transistors are p-type transistors, and
   the bias circuit comprises two n-type transistors which are connected between an operational potential of the input/output circuit and the gate electrode of the second transistor, and a potential of the bias voltage is lower than the operational potential by threshold voltages of the two n-type transistors.

4. The input/output circuit according to claim 1, wherein the third transistor impresses an internal potential to the gate electrode of the second transistor when the potential of the output terminal is lower than the internal potential.

5. The input/output circuit according to claim 1, further comprising:
   a fourth transistor of n-type driving the output terminal based on the predetermined signal; and
   a fifth transistor of n-type set up between the fourth transistor and the output terminal.

6. The input/output circuit according to claim 1, further comprising:
   a floating well charging circuit for charging a floating well of the second transistor based on the potential of the output terminal, the second transistor being formed on the floating well of a semiconductor substrate.

* * * * *